United States Patent [19]

Arai

[11] Patent Number: 6,111,295

[45] Date of Patent: Aug. 29, 2000

[54] SEMICONDUCTOR DEVICE HAVING CHANNEL STOPPER PORTIONS INTEGRALLY FORMED AS PART OF A WELL

[75] Inventor: Norihisa Arai, Omiya, Japan

[73] Assignee: Kabushiki Kaisha Toshiba, Kawasaki, Japan

[21] Appl. No.: 09/030,128

[22] Filed: Feb. 25, 1998

[30] Foreign Application Priority Data

Feb. 27, 1997 [JP] Japan ..................................... 9-044243

[51] Int. Cl.$^7$ ...................................................... H07L 31/06
[52] U.S. Cl. ............................................ 257/392; 257/398
[58] Field of Search ................................... 257/398, 399, 257/400, 392; 438/298

[56] References Cited

U.S. PATENT DOCUMENTS

| | | |
|---|---|---|
| 4,859,619 | 8/1989 | Wu et al. ..................................... 437/43 |
| 5,196,367 | 3/1993 | Lu et al. ..................................... 437/70 |
| 5,751,047 | 5/1998 | Ogura ......................................... 257/394 |

*Primary Examiner*—David Hardy
*Attorney, Agent, or Firm*—Banner, Witcoff, Ltd.

[57] ABSTRACT

The work surface of a p-type silicon substrate has a section where an E type MOSFET is formed, and a section where an I type MOSFET having a threshold voltage of about 0.1V is formed. The MOSFET is formed using a p-type well layer having a resistivity lower than that of the ground of the silicon substrate. The well layer includes deep and shallow portions which are integrally formed and have the same resistivity. The deep well portion defines an element area for forming the MOSFET, whereas the shallow well portions are arranged immediately below element isolation films surrounding the I type MOSFET, and function as channel stoppers.

28 Claims, 20 Drawing Sheets

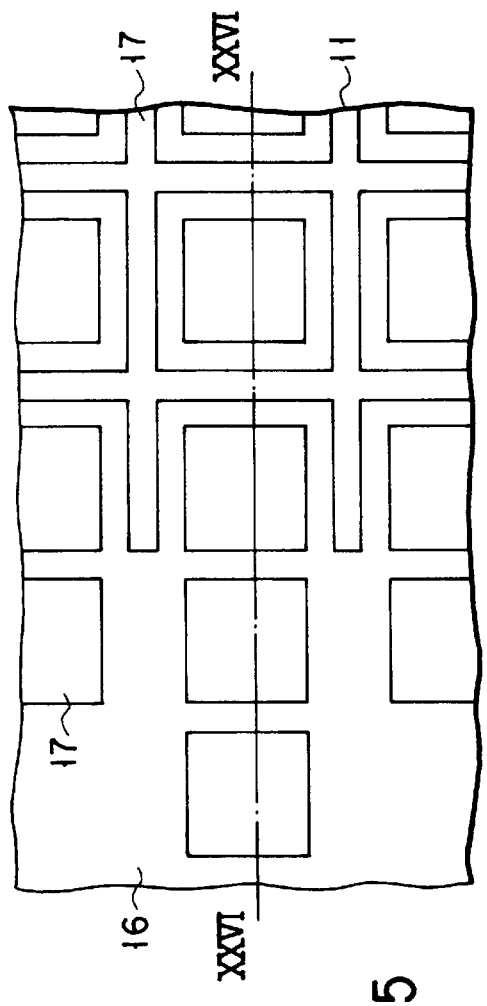
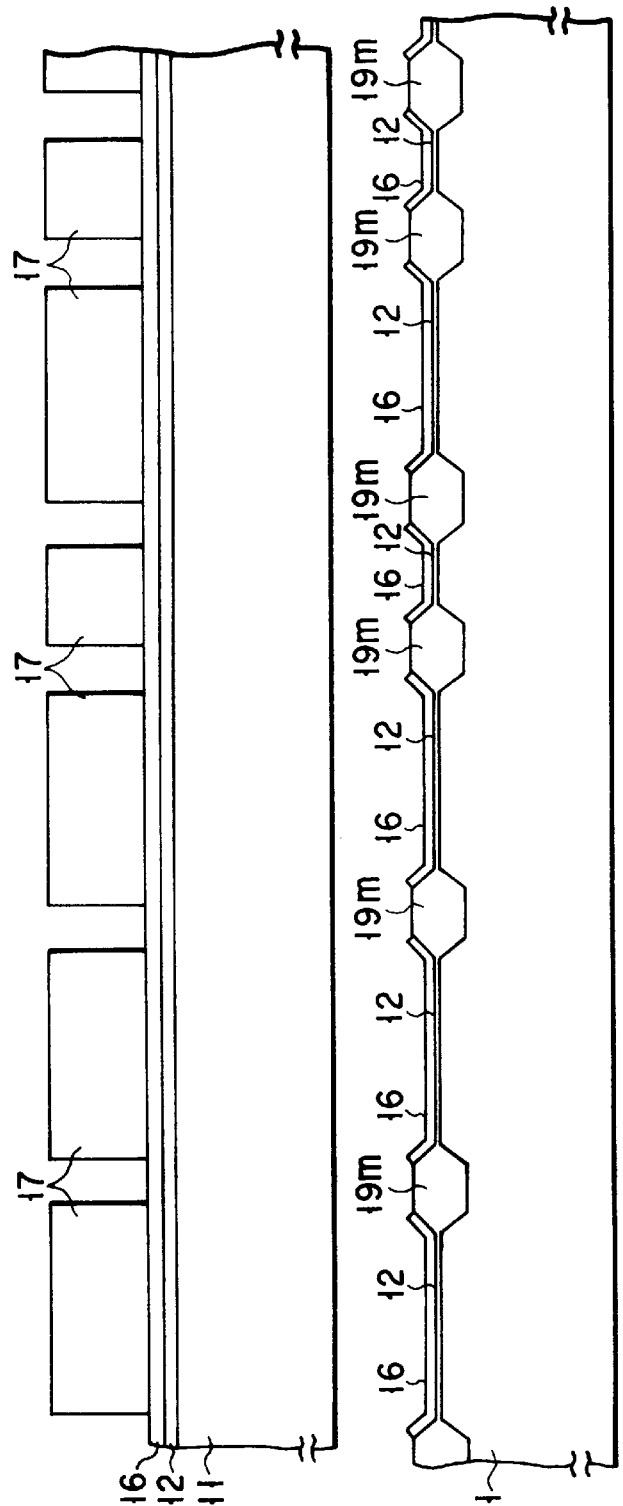
FIG. 25
FIG. 26
FIG. 27

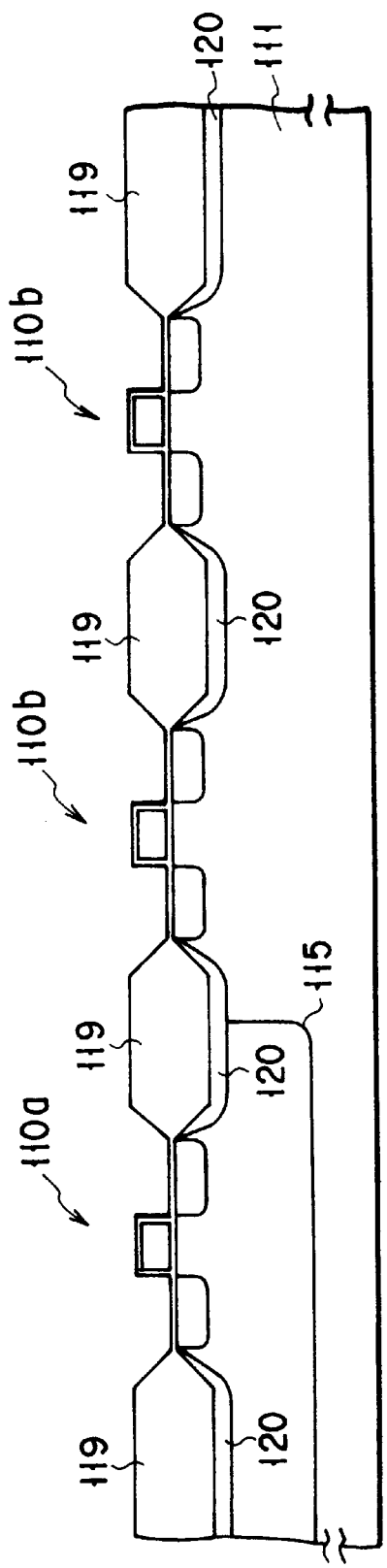
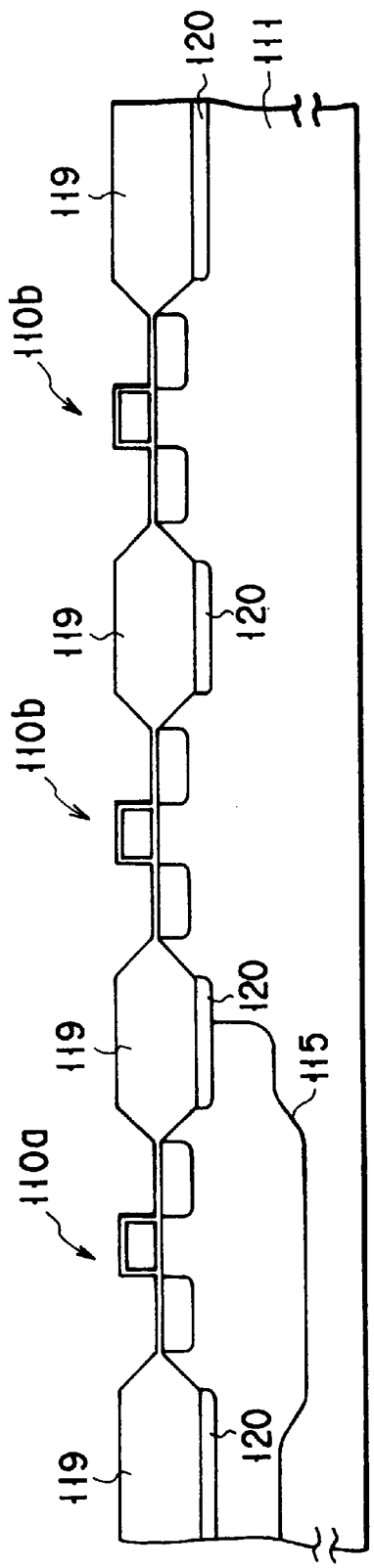
FIG. 33 PRIOR ART
FIG. 35 PRIOR ART

SEMICONDUCTOR DEVICE HAVING CHANNEL STOPPER PORTIONS INTEGRALLY FORMED AS PART OF A WELL

BACKGROUND OF THE INVENTION

The present invention relates to a semiconductor device having a field effect transistor such as a MOSFET or MISFET and a method of manufacturing the same and, more particularly, to a semiconductor device having an E (Enhancement) type or D (Depletion) type transistor and an I (Intrinsic) type transistor, and a method of manufacturing the same.

In the field of semiconductors, market demands for higher element densities within chips and low-cost LSIs (semiconductor devices) are still present even at present. Particularly, in semiconductor memories such as nonvolatile memories, an increase in memory capacity and a decrease in chip size by increasing the element density, and a reduction in manufacturing cost by simplifying the process are urgent subjects.

Conventional measures to decrease the chip size will be described by exemplifying a nonvolatile memory.

In a nonvolatile memory, a high voltage is used in a data write and erase. This high voltage is generally obtained by boosting an external power supply voltage using a booster circuit based on a charge pumping technique within an LSI (reference 1: "Design for CMOS VLSI", edited by Iizuka, Baifuukan, pp. 192–193).

The booster circuit must be constituted by a large-capacity capacitor element because it must generate a very high voltage. Increasing the capacity of the capacitor element generally means to increase the capacitor area, i.e., the capacitor element itself. Accordingly, the occupied area of the booster circuit on the chip increases, resulting in a large chip size and high cost.

To solve this problem, in the nonvolatile memory, the boosting efficiency is conventionally increased by constituting the booster circuit by a MOSFET having a threshold voltage as low as about 0.1V and a small back-gate bias effect, (which is to be referred to as an I (Intrinsic) type MOSFET).

An I type n-channel MOSFET can be formed on a p-type silicon substrate having an impurity concentration of about $2 \times 10^{16}$ cm$^{-3}$ because no threshold voltage control impurity is implanted in an element area (channel portion of the MOSFET) (reference 2: S. M. Sze, "Semiconductor Device", translated by Nanjitsu, Kawabe, and Hasegawa, Sangyotosho, pp. 220–221).

That is, since no threshold voltage control impurity is implanted in the channel portion, the I type MOSFET is different from a general E type MOSFET in which a threshold voltage control impurity is implanted in a channel portion. In addition, the I type MOSFET has a smaller back-gate bias effect than that of the E type MOSFET (reference 3: "Foundation of MOS Integrated Circuit", edited by Takeishi and Hara, Kindaikagakusha, pp. 12–13).

In this manner, constituting the booster circuit based on the charge pumping technique by the I type MOSFET contributes to a decrease in chip size because an increase in capacity of the capacitor element can be suppressed as low as possible in generating a high voltage.

In the field of semiconductors, the manufacturing cost must be reduced by simplifying the process (decreasing the number of steps) in order to achieve low-cost LSIs. Some conventional manufacturing methods will be described.

FIG. 33 is a sectional view of a semiconductor device formed by the first example of a conventional manufacturing process. FIG. 34 is a flow chart briefly showing the main steps of this manufacturing process.

As shown in FIG. 33, this semiconductor device comprises an E type or D type n-channel MOSFET 110a formed using a p-type well layer 115 in a p-type silicon substrate 111, and an I type MOSFET 110b formed using the ground of the p-type silicon substrate 111. Each element is surrounded by grating-like field oxide films, i.e., element isolation films 119. A p-type channel stopper diffusion layer 120 is formed immediately below each element isolation film 119.

In the first example of the manufacturing process, a PEP (PhotoEtching Process), ion implantation, and thermal diffusion are performed in step S11 to form the p-type well layer 115. In step S12, a PEP, ion implantation, and LOCOS oxidation are performed to form the element isolation films 119 and the p-type channel stopper diffusion layers 120. In step S13, a PEP and ion implantation are performed to implant an impurity for controlling the threshold voltage of the MOSFET 110a. In step S14, formation of the gate electrode and self-alignment ion implantation are performed to implant an impurity for forming source and drain layers. In step S15, the impurity is activated by annealing to complete the source and drain layers.

This manufacturing process is characterized by the well diffusion process and the three PEPs. That is, since the well diffusion process is a long-time thermal diffusion process, ion implantation for the well layer 115 and ion implantation for threshold voltage control or a channel stopper cannot be simultaneously performed.

FIG. 35 is a sectional view of a semiconductor device formed by the second example of the conventional manufacturing process. FIG. 36 is a flow chart briefly showing the main steps of this manufacturing process. The same reference numerals as in FIG. 33 denote the same parts of the sectional structure in FIG. 35, and a description thereof will be omitted.

In the second example of the manufacturing process, a PEP and LOCOS oxidation are performed in step S21 to form element isolation films 119. In step S22, a PEP and ion implantation are performed to implant an impurity for forming p-type channel stopper diffusion layers 120. In step S23, a PEP and ion implantation are performed to implant an impurity for controlling the threshold voltage of a MOSFET 110a and an impurity for forming a p-type well layer 115. In step S24, formation of a gate electrode and self-alignment ion implantation are performed to implant an impurity for forming source and drain layers. In step S25, the impurities are activated by annealing to complete the well layer 115, the channel stopper diffusion layers 120, and the source and drain layers.

FIGS. 37 to 42 are views sequentially showing the third example of the conventional manufacturing process as an improvement of the second example. FIG. 43 is a flow chart briefly showing the main steps of this manufacturing process.

In the third example of the manufacturing process, as shown in FIGS. 37 and 38, a silicon oxide film 112 is formed on a p-type silicon substrate 111 by, e.g., thermal oxidation. A silicon nitride film 116 is formed on the silicon oxide film 112 by, e.g., LPCVD.

A resist pattern 117 is formed on the silicon nitride film 116 by a PEP (PhotoEtching Process). Using the resist pattern 117 as a mask, the silicon nitride film 116 is patterned by RIE (Reactive Ion Etching).

Using the resist pattern 117 as a mask, a p-type impurity (e.g., boron ions) 118 is ion-implanted in the silicon substrate 111. Then, the resist pattern 117 is removed.

As shown in FIG. 39, LOCOS oxidation is performed using the silicon nitride film 116 as a mask to form field oxide films 119 having a film thickness of about 500 nm on the silicon substrate 111. At the same time, p-type diffusion layers (channel stoppers) 120 are formed immediately below the field oxide films 119. Thereafter, the silicon nitride film 116 is removed.

As shown in FIGS. 40 and 41, a resist pattern 121 is formed on the silicon oxide films 112 and the field oxide films 119 by a PEP. The resist pattern 121 has an opening above an element area where a general E type MOSFET is to be formed, and covers an element area where an I type MOSFET is to be formed.

Using the resist pattern 121 as a mask, a p-type impurity (e.g., boron ions) 128 is implanted to a deep portion in the silicon substrate 111 by high-energy ion implantation using a plurality of different acceleration energies of, e.g., about 400 keV and 300 keV.

Using the resist pattern 121 as a mask, a p-type impurity (e.g., boron ions) 129 for controlling the threshold voltage of the MOSFET is ion-implanted in the silicon substrate 111 using a low acceleration energy of about 40 keV. After that, the resist pattern 121 and the silicon oxide films 112 are removed.

As shown in FIG. 42, gate oxide films 123 are formed in the element areas surrounded by the field oxide films 119 by, e.g., thermal oxidation. Gate electrodes 124 are formed on the gate oxide films 123. Using the gate electrodes 124 as a mask, an n-type impurity (e.g., phosphorus) is implanted in the silicon substrate 111 by self alignment.

Silicon oxide films 130 are formed on the surfaces of the gate electrodes 124 by thermal oxidation. At the same time, the impurities in the silicon substrate 111 are activated to form a p-type well layer 115 and source and drain layers 125.

In short, as shown in FIG. 43, in the third example of the manufacturing process, a PEP, ion implantation, and LOCOS oxidation are performed in step S31 to form the element isolation films 119 and the p-type channel stopper diffusion layers 120. In step S32, a PEP and ion implantation are performed to implant an impurity for controlling the threshold voltage of the MOSFET 110a and an impurity for forming the p-type well layer 115. In step S33, formation of the gate electrodes 124 and self-alignment ion implantation are performed to implant an impurity for forming the source and drain layers 125. In step S34, the impurities are activated by annealing to complete the well layer 115 and the source and drain layers 125.

The feature of second and third examples of the manufacturing process is to implant an impurity to a deep portion in the silicon substrate using a high acceleration energy, and form the well layer 115 by activating the impurity. This manufacturing process does not require any long-time well diffusion process, and can contribute to a reduction in manufacturing cost owing to a short manufacturing time. In addition, this manufacturing process can also contribute to a reduction in cost by decreasing the number of PEPs because ion implantation for controlling the threshold voltage of the MOSFET 110a and ion implantation for forming the well layer 115 can be executed using the same mask.

According to the third example of the manufacturing process, the number of PEPs can be further decreased by one as a whole because the mask pattern (resist pattern 117) used in ion implantation for forming the p-type diffusion layers (channel stoppers) 120, and the pattern of the mask (silicon nitride film 116) used to form the field oxide films 119 are the same.

As described above, in the field of semiconductors, the market demands for a decrease in chip size by increasing the element density within the chip, and a reduction in manufacturing cost by simplifying the manufacturing process still remain. For example, in the nonvolatile memory, the booster circuit is constituted by the I type MOSFET in order to decrease the area of the booster circuit on the chip and reduce the chip size. The number of PEPs is decreased by using high-energy ion implantation in order to reduce the manufacturing cost by simplifying the manufacturing process.

However, if the manufacturing process of an LSI (semiconductor device) having both an E type MOSFET and an I type MOSFET is directly applied to an LSI not having any I type MOSFET, the process may become wasteful. Development of a technique which can be applied to all LSIs having MOSFETs and can simultaneously achieve a decrease in chip size by increasing the element density within the chip, and a reduction in manufacturing cost by simplifying the manufacturing process is desired.

BRIEF SUMMARY OF THE INVENTION

It is an object of the present invention to provide a semiconductor device and a method of manufacturing the same in which a decrease in chip size and a reduction in manufacturing cost can be simultaneously achieved.

According to a first aspect of the present invention, there is provided a semiconductor device comprising:
a semiconductor substrate of a first conductivity type having a common surface and a ground with a first resistivity;
a well layer of a first conductivity type formed in the common surface and having a second resistivity lower than the first resistivity, the well layer having a first portion for defining a first element area with the second resistivity, which consists essentially of part of the well layer, and a second portion for surrounding part of the substrate and defining a second element area with the first resistivity, which consists essentially of the ground; and
first and second transistors formed of field effect transistors with channels of a second conductivity type which are respectively arranged in the first and second element areas, each of the first and second transistors having source and drain layers of the second conductivity type which interpose a channel region in a channel-length direction, and a gate electrode facing the channel region via a gate insulating film.

According to a second aspect of the present invention, there is provided a method of manufacturing the semiconductor device of the first aspect,
the device further comprising an isolation layer consisting essentially of an insulator arranged in the common surface to surround the second element area, the second portion of the well layer being formed immediately below the isolation layer,
the method comprising the steps of:
forming the isolation layer in the common surface;
forming a first mask to cover a portion of the common surface corresponding to the second element area and have an opening at portions of the common surface corresponding to the first element area and the isolation layer;

simultaneously ion-implanting, using the first mask, a first carrier impurity of the first conductivity type in a portion of the common surface corresponding to the first element area and immediately below the isolation layer;

forming the gate insulating films on the common surface;

forming the gate electrodes in the first and second element areas;

simultaneously ion-implanting, using the gate electrodes as a mask, a second carrier impurity of the second conductivity type in portions of the common surface corresponding to the source and drain layers of the first and second transistors; and activating the first and second carrier impurities by annealing to simultaneously form the well layer, the source and drain layers of the first and second transistors.

According to a third aspect of the present invention, there is provided a semiconductor device comprising:

a semiconductor substrate of a first conductivity type having a common surface and a ground with a first resistivity;

first and second isolation layers consisting essentially of insulators formed in the common surface, the first and second isolation layers surrounding part of the substrate and respectively defining first and second element areas with the first resistivity, which consist essentially of the ground;

first and second transistors formed of field effect transistors with channels of a second conductivity type which are respectively arranged in the first and second element areas, each of the first and second transistors having source and drain layers of the second conductivity type which interpose a channel region in a channel-length direction, and a gate electrode facing the channel region via a gate insulating film; and an intervening diffusion layer of the first conductivity type formed in the common surface to separate the first and second isolation layers, and having a second resistivity lower than the first resistivity.

According to a fourth aspect of the present invention, there is provided a method of manufacturing the semiconductor device of the third aspect, the device further comprising a well layer of the second conductivity type formed in the common surface to define a third element area, and a third transistor formed of a field effect transistor with a channel of the first conductivity type which is arranged in the third element area, the third transistor having source and drain layers of the first conductivity type which interpose a channel region in the channel-length direction, and a gate electrode facing the channel region of the third transistor via a gate insulating film, the method comprising the steps of:
forming the isolation layers in the common surface;
forming a first mask to cover portions of the common surface corresponding to the first and second element areas, and have an opening at a portion of the common surface corresponding to the third element area;
ion-implanting, using the first mask, a first carrier impurity of the second conductivity type in the portion of the common surface corresponding to the third element area;
forming the gate insulating films on the common surface;
respectively forming the gate electrodes in the first to third element areas;
forming a second mask to cover portions of the common surface corresponding to the third element area and the intervening diffusion layer, and have openings at portions of the common surface corresponding to the first and second element areas;
simultaneously ion-implanting a second carrier impurity of the second conductivity type in portions of the common surface corresponding to the source and drain layers of the first and second transistors, by using the second mask and the gate electrodes in the first and second element areas as a mask;
forming a third mask to cover portions of the common surface corresponding to the first and second element areas, and have an opening at portions of the common surface corresponding to the third element area and the intervening diffusion layer;
simultaneously ion-implanting a third carrier impurity of the first conductivity type in portions of the common surface corresponding to the source and drain layers of the third transistor and the intervening diffusion layer, by using the third mask and the gate electrode in the third element area as a mask; and
activating the first to third carrier impurities by annealing to simultaneously form the well layer, the source and drain layers of the first to third transistors, and the intervening diffusion layer.

Note that, the term, a carrier impurity, means an impurity for providing a semiconductor layer with carriers, and materials simply referred to as an impurity hereinafter all denote a carrier impurity. Further, in addition to MOSFETs, the present invention may be similarly applied to MISFETs which employ a gate insulating film formed of an insulating film other than an oxide film. Furthermore, the present invention is similarly applied to P-channel and N-channel structures, and in particular, is effective for a semiconductor device having a CMOS structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 13 to 19 are views sequentially showing steps in a semiconductor device manufacturing method according to the first embodiment, in which FIGS. 13 and 16 are plan views of the layout, and FIGS. 14, 15, and 17 to 19 are sectional views;

FIGS. 25 to 32 are views sequentially showing steps in a semiconductor device manufacturing method according to the sixth embodiment, in which FIGS. 25 and 28 are plan views of the layout, and FIGS. 26, 27, and 29 to 32 are sectional views;

FIG. 33 is a sectional view of a semiconductor device formed by the first example of a conventional manufacturing process;

FIG. 35 is a sectional view of a semiconductor device formed by the second example of the conventional manufacturing process;

FIGS. 37 to 42 are views sequentially showing the third example of the conventional manufacturing process, in which FIGS. 37 and 40 are plan views of the layout, and FIGS. 38, 39, 41, and 42 are sectional views.

DETAILED DESCRIPTION OF THE INVENTION

Figure 1:
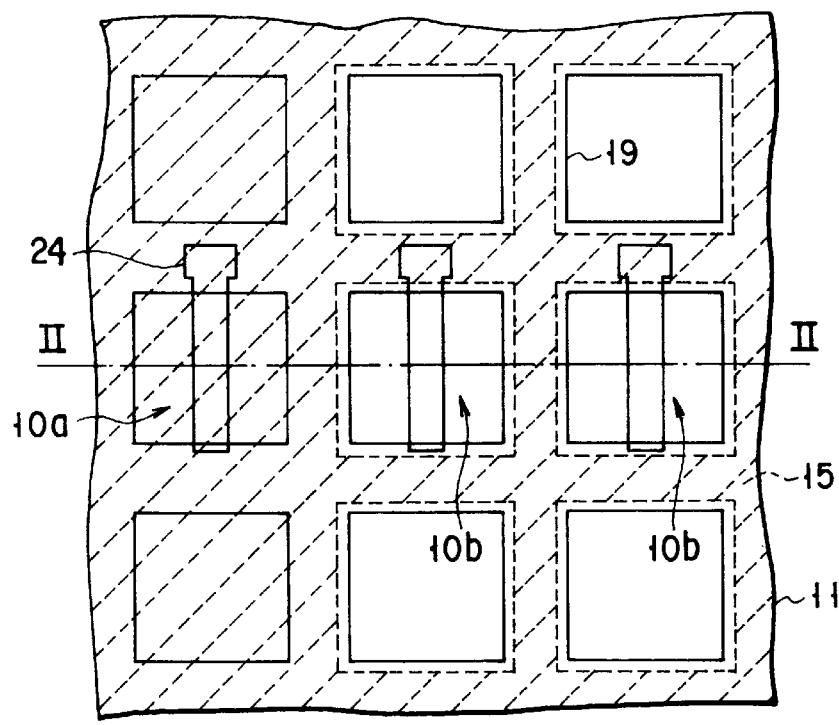
FIG. 1 is a plan view showing the layout of a semiconductor device according to the first embodiment of the present invention.
Figure 2:
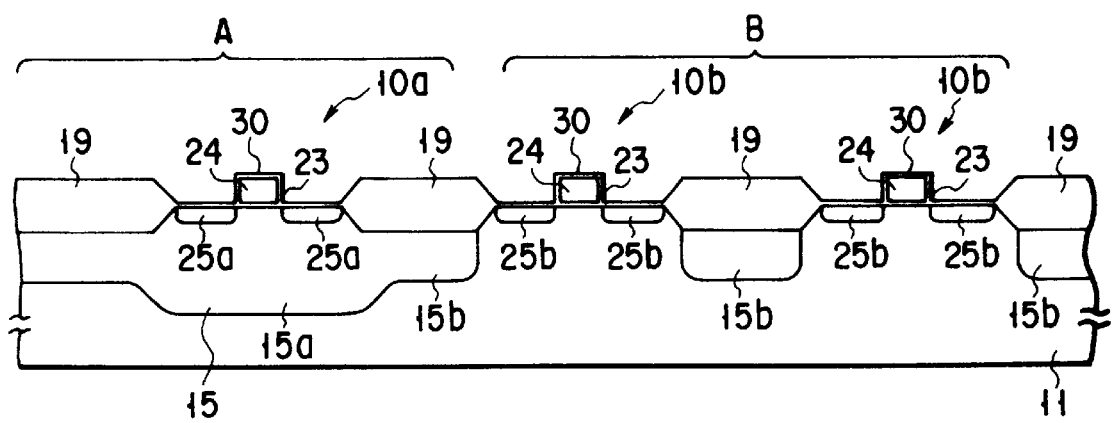
FIG. 2 is a sectional view taken along the line II—II in FIG. 1.

FIG. 1 is a plan view showing the layout of a semiconductor device according to the first embodiment of the present invention. FIG. 2 is a sectional view taken along the line II—II in FIG. 1.

This embodiment is directed to a semiconductor device (e.g., a flash EEPROM) having an E (Enhancement) type MOSFET with a threshold voltage (about 0.7 V) controlled by ion implantation, and an I type MOSFET with a threshold voltage of about 0.1V.

A target processing surface of a p-type silicon substrate 11 has section A where an E type or D (Depletion) type MOSFET 10a is to be formed, and section B where an I type MOSFET 10b is to be formed.

In section A, e.g., the E type n-channel MOSFET 10a is formed in an element area surrounded by grating-like field oxide films 19. The MOSFET 10a is formed in a p-type well layer 15 having a resistivity lower than that of the ground of the substrate 11.

The well layer 15 includes a deep portion 15a immediately below the element area for forming the MOSFET 10a, and shallow portions 15b immediately below the field oxide films 19. The shallow well portion 15b functions as a channel stopper. The shallow well portion 15b is different from a p-type channel stopper diffusion layer formed only immediately below a conventional field oxide film in that the shallow well portion 15b is formed integrally with the deep well portion 15a and has substantially the same impurity concentration and resistivity as those of the deep well portion 15a.

The MOSFET 10a in section A has a gate oxide film 23, a gate electrode 24, and source and drain layers 25a. A silicon oxide film 30 is formed on the surface of the gate electrode 24.

In section B, the I type n-channel MOSFET 10b is formed in an element area surrounded by field oxide films 19. The MOSFET 10b is directly formed in the ground of the silicon substrate 11.

Well portions 15b functioning as channel stoppers are formed immediately below the field oxide films 19 in section B. The well portion 15b in section B is formed integrally with the well portion 15b in section A, and has substantially the same impurity concentration, resistivity, and depth as those of the well portion 15b in section A.

As described above, the well portion 15b in section B functions as a channel stopper for preventing formation of a channel immediately below the field oxide film 19. This well portion 15b is different from a p-type channel stopper diffusion layer formed only immediately below a conventional field oxide film in that the well portion 15b is formed integrally with the deep well portion 15a in section A and has substantially the same impurity concentration and resistivity as those of the deep well portion 15a.

Each MOSFET 10b in section B has a gate oxide film 23, a gate electrode 24, and source and drain layers 25b. A silicon oxide film 30 is formed on the surface of the gate electrode 24.

In the semiconductor device having the above arrangement, the I type MOSFET 10b is formed in section B. By using the MOSFET 10b as, e.g., a booster circuit based on the charge pumping technique, the chip size can be decreased.

The well portion 15b functioning as a channel stopper is formed immediately below the field oxide film 19 integrally with the deep well portion 15a where the E type or D type MOSFET is formed.

That is, in the semiconductor device of this embodiment, since the well layer and the diffusion layer serving as a channel stopper need not be separately formed, unlike a conventional device, the manufacturing process can be simplified to reduce the manufacturing cost.

Figure 3:
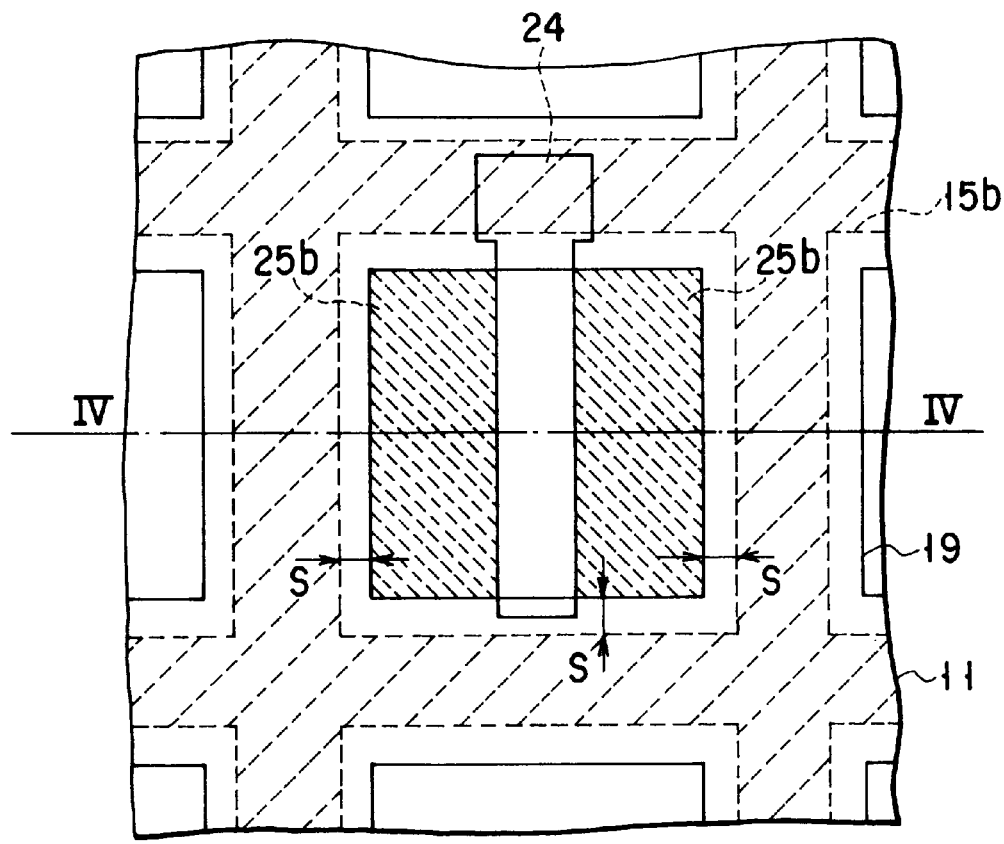
FIG. 3 is a plan view showing the layout of part of the semiconductor device in FIG. 1 in detail.
Figure 4:
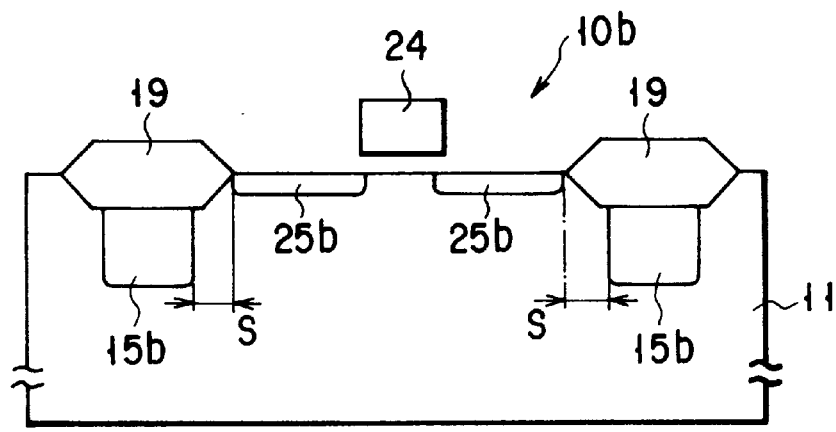
FIG. 4 is a sectional view taken along the line IV—IV in FIG. 3.

FIG. 3 shows only section B of the semiconductor device according to the first embodiment. FIG. 4 is a sectional view taken along the line IV—IV in FIG. 3.

In the first embodiment, the well portions 15b and the source and drain layers 25b are spaced apart from each other by a predetermined offset width (e.g., about 1 μm) S. This offset width S is set to prevent variations in threshold voltage of the I type MOSFET 10b and a narrow channel effect (effect of narrowing the channel width).

Figure 5:
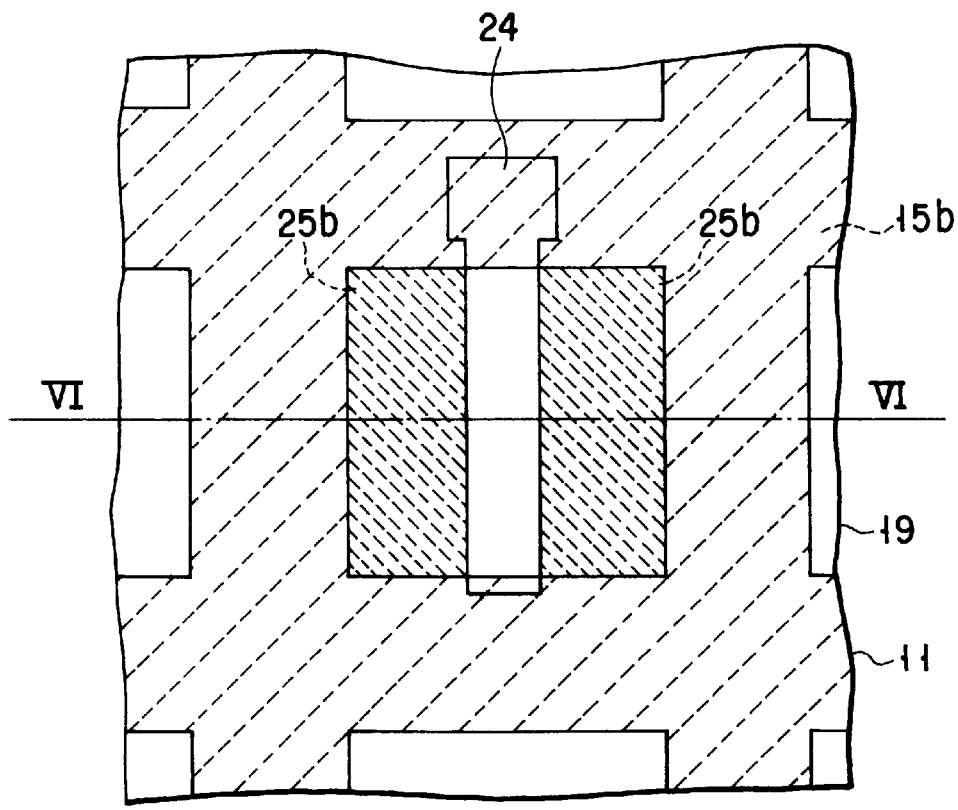
FIG. 5 is a plan view showing the layout of a semiconductor device according to the second embodiment of the present invention.
Figure 6:
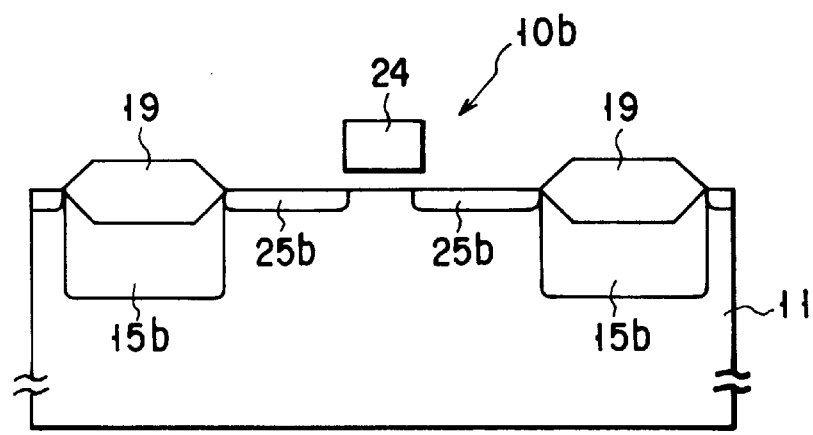
FIG. 6 is a sectional view taken along the line VI—VI in FIG. 5.

FIG. 5 is a plan view showing the layout of a semiconductor device according to the second embodiment of the present invention. FIG. 6 is a sectional view taken along the line VI—VI in FIG. 5.

The semiconductor device of the second embodiment is a modification of the first embodiment described above. That is, in the first embodiment, the well portions 15b and the source and drain layers 25b are spaced apart from each other by the predetermined offset width S. In the second embodiment, the offset width S between a well portion 15b and a source or drain layer 25b is set to 0.

The second embodiment is effective for a semiconductor device constituted by a MOSFET having a gate width and gate length large enough to ignore variations in threshold voltage of the MOSFET and the narrow channel effect caused by entrance of an impurity within the well portion 15b into the channel region of a MOSFET 10b.

Figure 7:
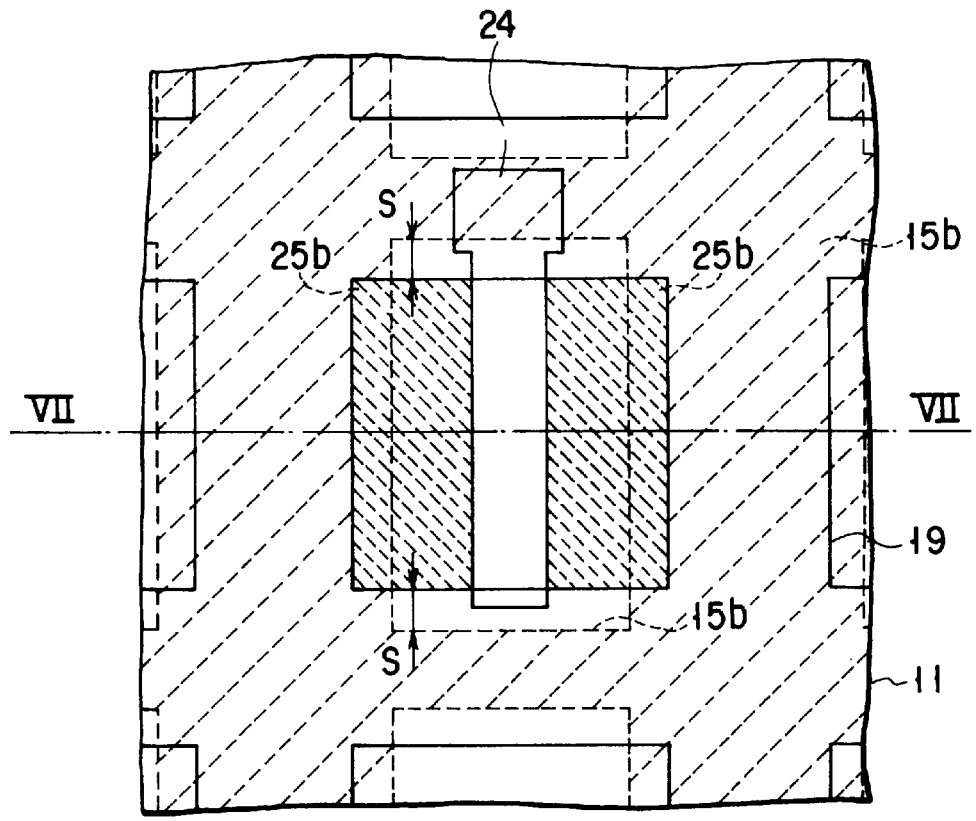
FIG. 7 is a plan view showing the layout of a semiconductor device according to the third embodiment of the present invention.
Figure 8:
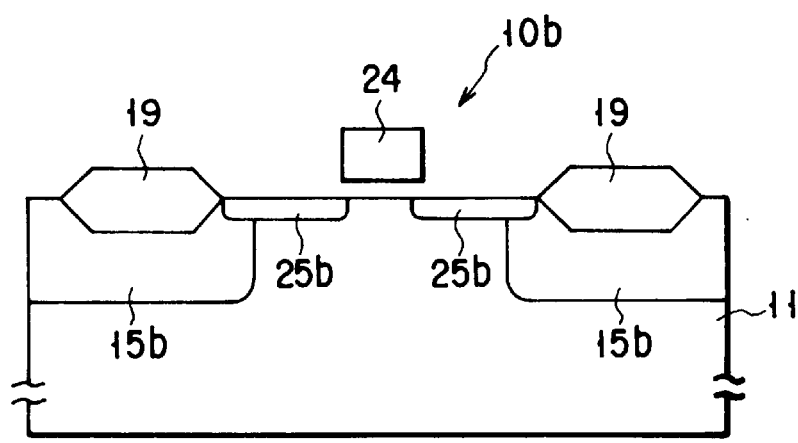
FIG. 8 is a sectional view taken along the line VII—VII in FIG. 7.

FIG. 7 is a plan view showing the layout of a semiconductor device according to the third embodiment of the present invention. FIG. 8 is a sectional view taken along the line VII—VII in FIG. 7.

In the third embodiment, in the channel-width direction of a MOSFET 10b, well portions 15b and source and drain layers 25b are spaced apart from each other by a predetermined offset width (e.g., about 1 μm) S. In the channel-length direction of the MOSFET 10b, the offset width S between the well portion 15b and the source or drain layer 25b is set to 0.

More specifically, in the channel-width direction, variations in threshold voltage of the MOSFET and the narrow channel effect can be effectively prevented by setting the offset width S between the well portion 15b and the source or drain layer 25b. In the channel-length direction, the density of elements (MOSFETs) can be increased by not setting any offset width S between the well portion 15b and the source or drain layer 25b.

Figure 9:
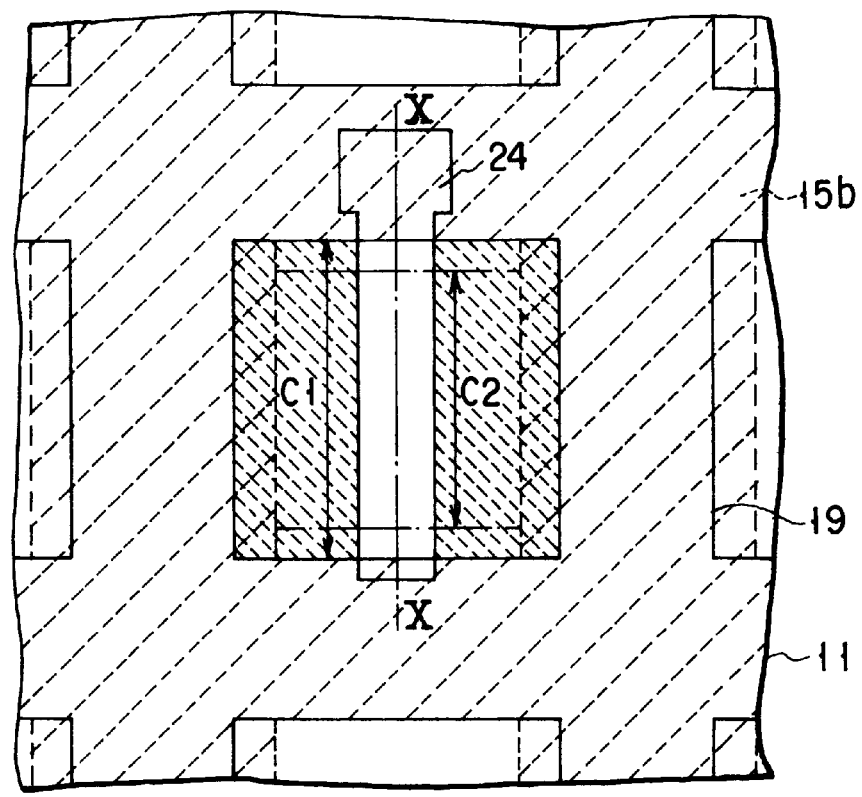
FIG. 9 is a plan view showing the layout of a semiconductor device according to the fourth embodiment of the present invention.
Figure 10:
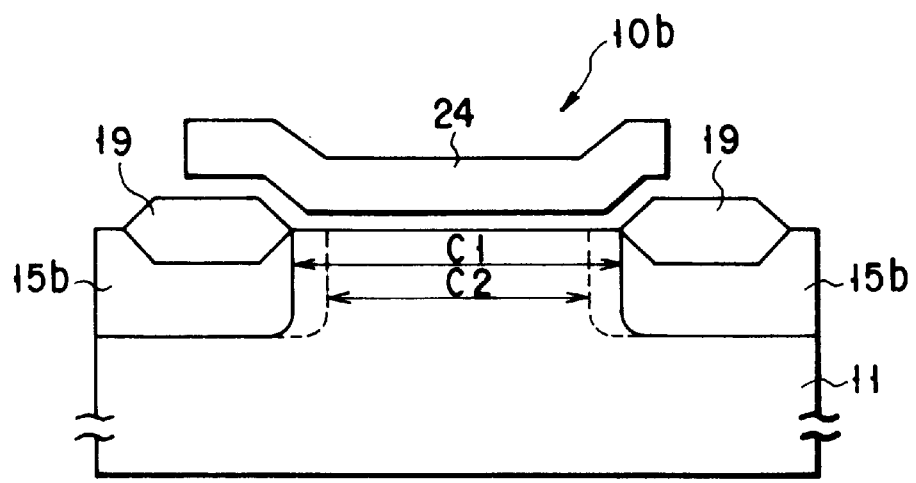
FIG. 10 is a sectional view taken along the line X—X in FIG. 9.

FIG. 9 is a plan view showing the layout of a semiconductor device according to the fourth embodiment of the present invention. FIG. 10 is a sectional view taken along the line X—X in FIG. 9.

In the fourth embodiment, the offset width S between a well portion 15b and a source or drain layer 25b is set to 0 in both the widthwise and longitudinal directions of channel of a MOSFET 10b.

In the channel-width direction, an impurity in the well portion 15b enters the channel of the MOSFET 10b to cause variations in threshold voltage of the MOSFET, and the narrow channel effect of narrowing the channel width from C1 to C2.

Accordingly, this embodiment is effective for a semiconductor device constituted by a MOSFET which is required to achieve a high element density and has a gate width and gate length large enough to ignore variations in threshold voltage of the MOSFET 10b and the narrow channel effect.

Figure 11:
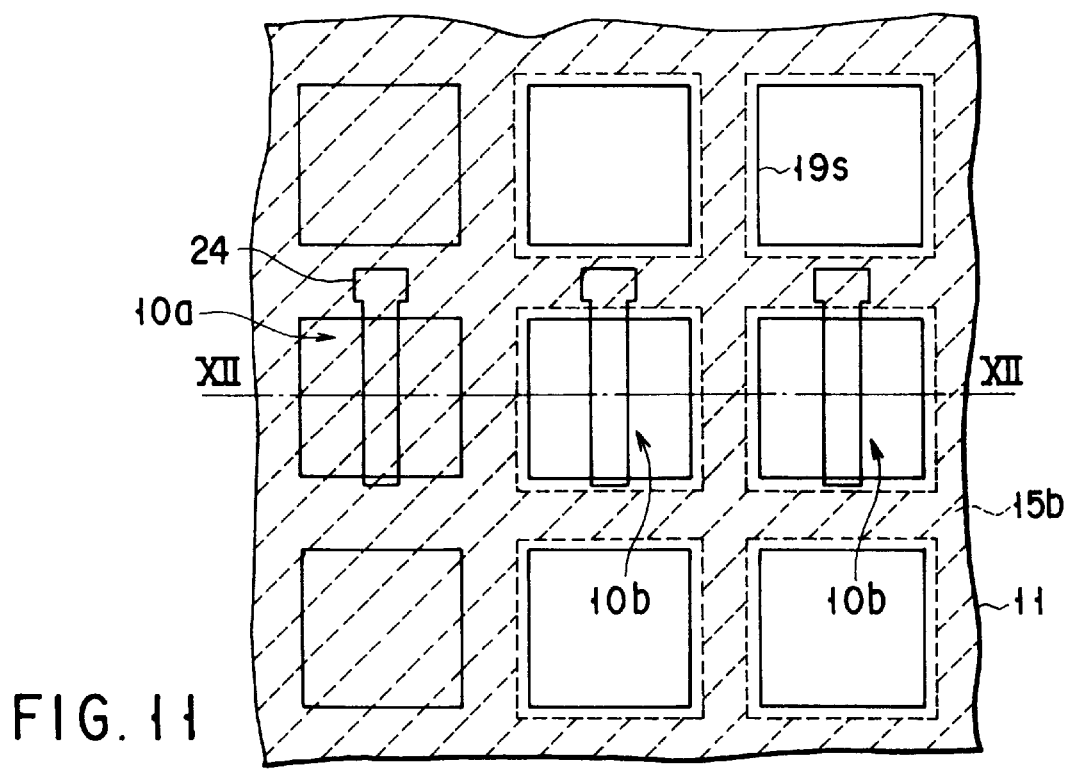
FIG. 11 is a plan view showing the layout of a semiconductor device according to the fifth embodiment of the present invention.
Figure 12:
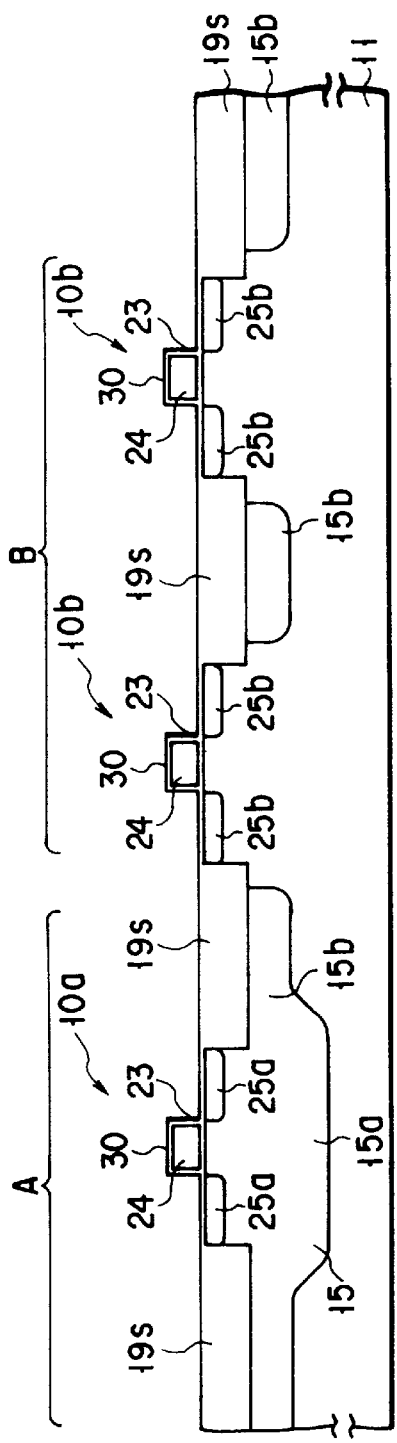
FIG. 12 is a sectional view taken along the line XII—XII in FIG. 11.

FIG. 11 is a plan view showing the layout of a semiconductor device according to the fifth embodiment of the present invention. FIG. 12 is a sectional view taken along the line XII—XII in FIG. 11.

The semiconductor device of the fifth embodiment is a modification of the first embodiment. More specifically, in the first embodiment, the field oxide film formed by LOCOS is used as an element isolation film. In the fifth embodiment, an oxide film having an STI (Shallow Trench Isolation) structure is used as an element isolation film. The STI structure is realized by forming a trench in the surface of a semiconductor substrate and burying an insulating film in the trench.

Also in the fifth embodiment, a p-type well layer 15 is formed to have well portions 15a and 15b respectively in an element area and immediately below element isolation films 19s. That is, in section A where, e.g., an E type MOSFET 10a is to be formed, the well portions 15a and 15b are formed to extend from the element area to portions immediately below the element isolation films 19s. In section B where an I type MOSFET 10b is to be formed, the well portion 15b is formed immediately below the element isolation film 19s.

A method of manufacturing a semiconductor device according to the present invention will be described below.

This manufacturing method is applicable to all the semiconductor devices according to the first to fourth embodiments described above. This method can also be applied to the semiconductor device according to the fifth embodiment except for a method of forming an element isolation film.

Figure 13:
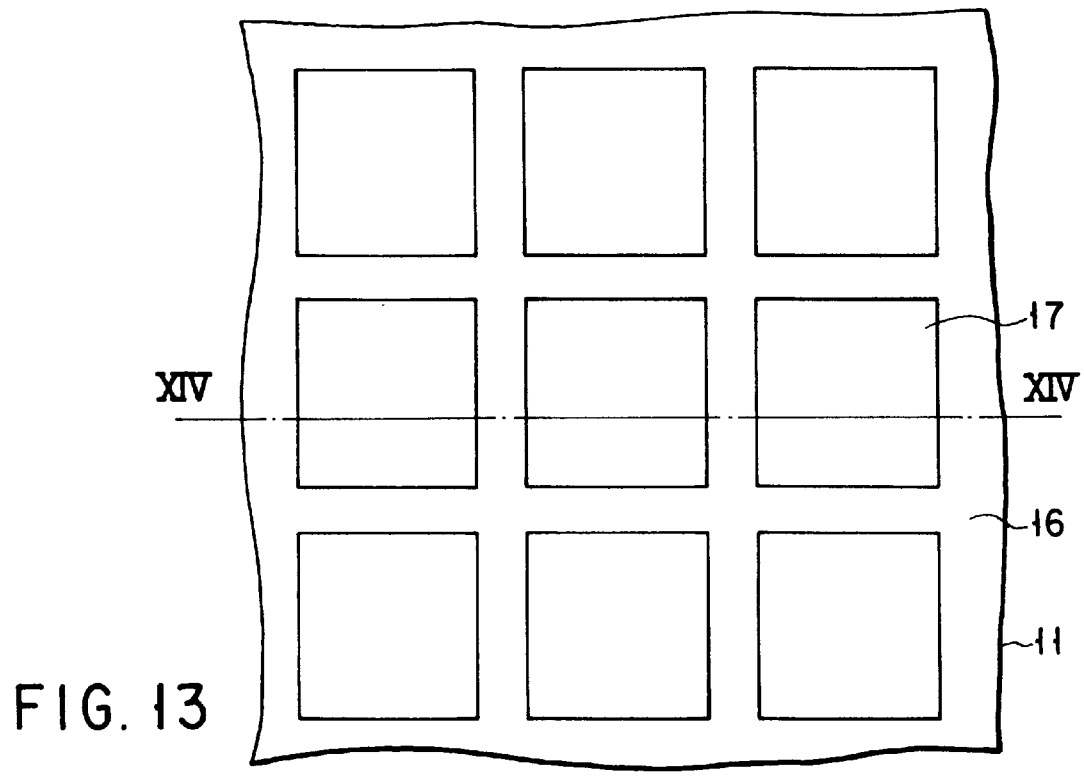
Figure 14:
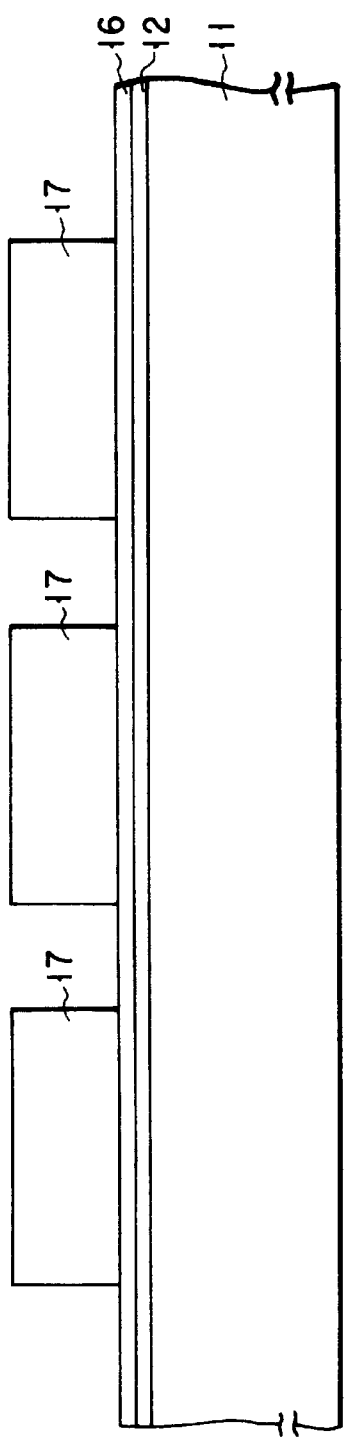

As shown in FIGS. 13 and 14, a silicon oxide film 12 is formed on a p-type silicon substrate 11 by, e.g., thermal oxidation. A silicon nitride film 16 is formed on the silicon oxide film 12 by, e.g., LPCVD. A resist pattern 17 is formed on the silicon nitride film 16 by a PEP (PhotoEtching Process).

Using the resist pattern 17 as a mask, the silicon nitride film 16 is patterned by, e.g., RIE (Reactive Ion Etching). Then, the resist pattern 17 is removed.

Figure 15:
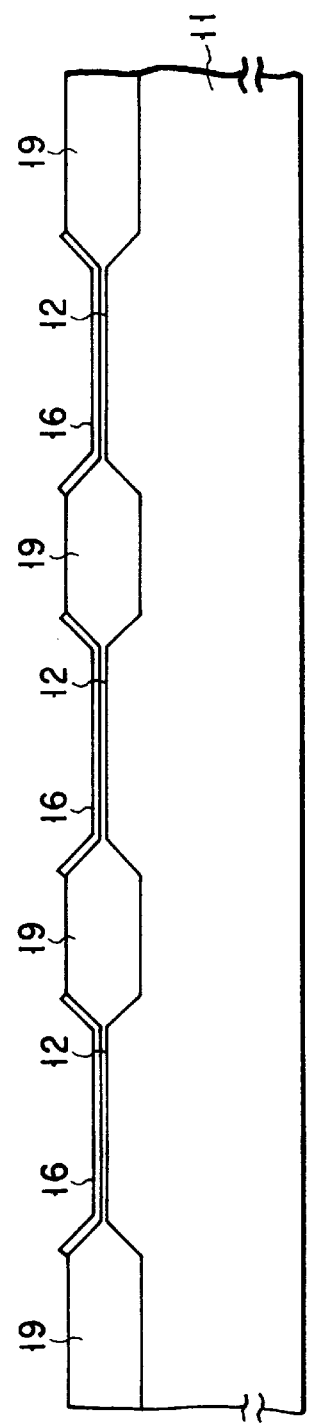

As shown in FIG. 15, LOCOS oxidation is performed using the silicon nitride film 16 as a mask to form field oxide films 19 having a film thickness of about 600 nm on the silicon substrate 11. Thereafter, the silicon nitride film 16 and the silicon oxide film 12 are removed.

When an element isolation film having an STI structure is used, a trench is formed in the silicon substrate 11, and a silicon oxide film is buried in this trench using, e.g., LPCVD and CMP (Chemical Mechanical Polishing).

Figure 16:
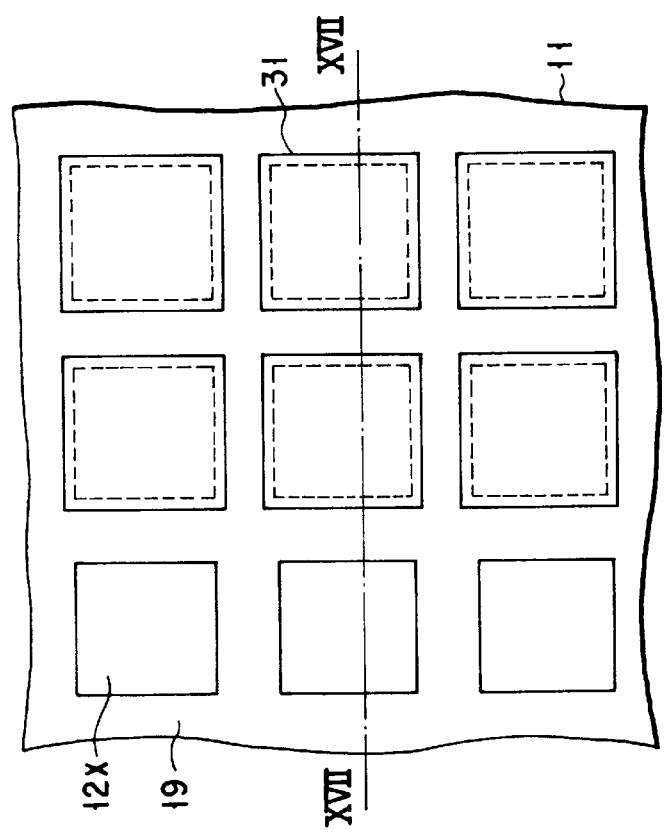
Figure 17:
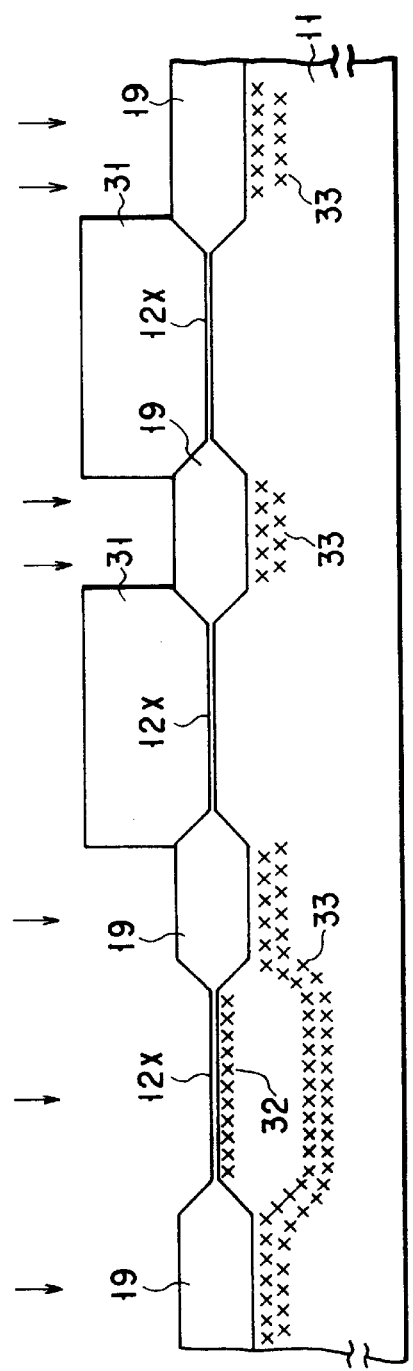

As shown in FIGS. 16 and 17, silicon oxide films 12x having a thickness of about 20 nm are newly formed by thermal oxidation in element areas surrounded by the field oxide films 19. A resist pattern 31 is formed by a PEP (PhotoEtching Process) to have openings above the field oxide films 19 and some element areas (portions corresponding to the E type or D type MOSFETs 10a), and to cover the remaining element areas (portions corresponding to the I type MOSFETs 10b).

Using the resist pattern 31 as a mask, a p-type impurity (e.g., boron ions) 32 is ion-implanted in a portion corresponding to the MOSFET 10a at a low acceleration energy of about 40 keV and a dose of about $2.5 \times 10^{13}$ cm$^{-2}$. Since this ion implantation (for controlling the threshold voltage of the MOSFET 10a) uses the low acceleration energy, the impurity 32 is implanted in only the surface portions of some element areas of the silicon substrate 11.

Subsequently, using the resist pattern 31 as a mask, a p-type impurity (e.g., boron ions) 33 is ion-implanted in the silicon substrate 11 at high acceleration energies of about 300 keV and about 400 keV and a dose of about $2 \times 10^{13}$ cm$^{-2}$. Since this ion implantation (for forming a well layer 15) uses the high acceleration energies, the impurity 33 is implanted to a portion corresponding to the deep portion 15a of the well layer 15 in the silicon substrate 11, and to a portion corresponding to the shallow portion 15b of the well layer 15 immediately below the field oxide film 19. After that, the resist pattern 31 and the silicon oxide films 12x are removed.

The high-energy ion implantation of the p-type impurity (ions) uses the two different acceleration energies, but may use one or three or more different acceleration energies. The order of ion implantation for controlling the threshold voltage and ion implantation for forming the well layer is arbitrary.

Figure 18:
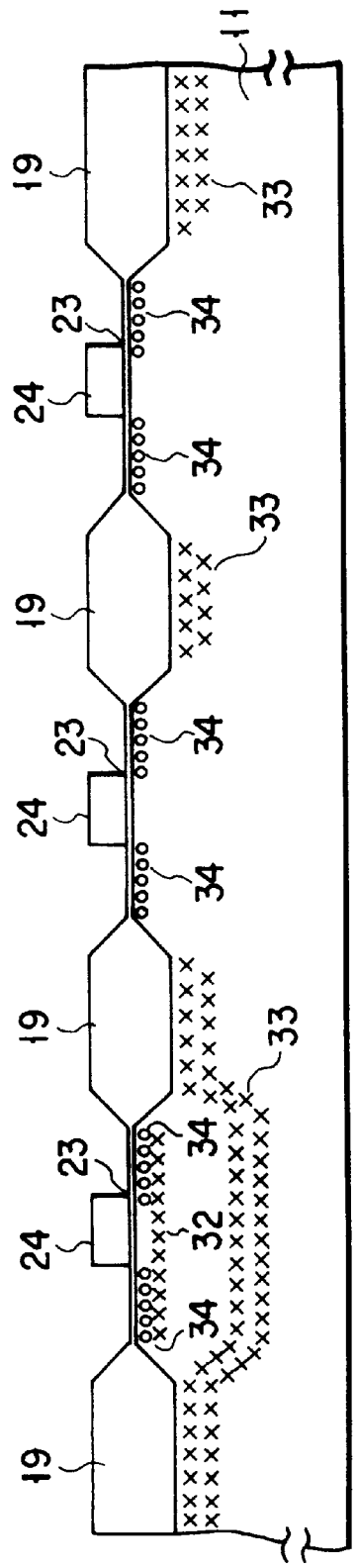

As shown in FIG. 18, gate oxide films 23 are formed by, e.g., thermal oxidation in the element areas surrounded by the field oxide films 19. Gate electrodes 24 are respectively formed on the gate oxide films 23.

Using the gate electrodes 24 as a mask, an n-type impurity (e.g., arsenic) 34 is implanted in portions corresponding to the source and drain layers 25a and 25b by self alignment at an acceleration energy of about 60 keV and a dose of about $4.0 \times 10^{15}$ cm$^{-2}$.

Figure 19:
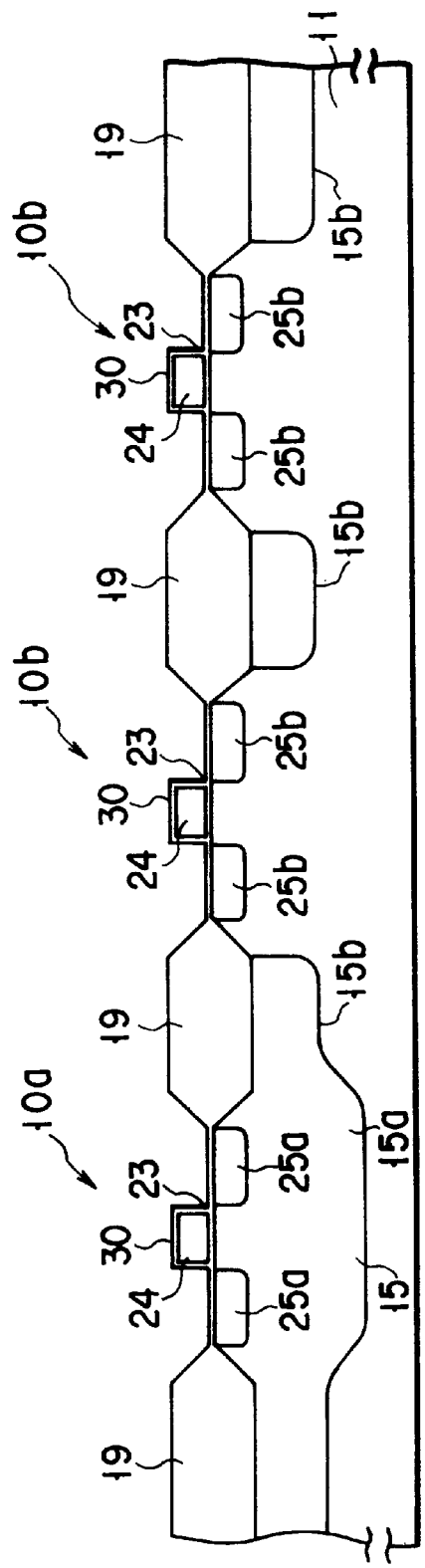

As shown in FIG. 19, the obtained structure is subjected to thermal oxidation in the oxygen atmosphere at a temperature of about 850° C. for 40 min to form silicon oxide films 30 on the surfaces of the gate electrodes 24. This annealing activates the impurities in the silicon substrate 11 to simultaneously form the p-type well layer 15 and the n-type source and drain layers 25a and 25b.

By the above manufacturing process, semiconductor elements (MOSFETS 10a and 10b) are formed on the silicon substrate 11.

Figure 20:
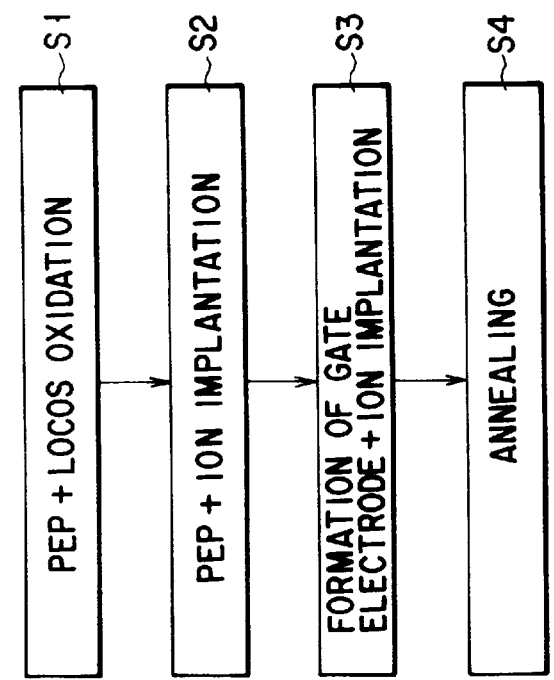
FIG. 20 is a flow chart briefly showing the main steps of the manufacturing process of the present invention.

FIG. 20 is a flow chart briefly showing the main steps of the above manufacturing process.

More specifically, in step S1, a PEP and LOCOS oxidation are performed to form the element isolation films 19. In step S2, a PEP and ion implantation are performed to implant impurities for controlling the threshold voltage of the MOSFET 10a and forming the well layer 15 (including the channel stopper). In step S3, formation of the gate electrodes 24 and self-alignment ion implantation are performed to implant an impurity for forming the source and drain layers 25a and 25b. In step S4, the impurities are activated by annealing to complete the well layer 15 and the source and drain layers 25a and 25b.

The first feature of the manufacturing process is to implant an impurity to a deep portion in the silicon substrate 11 by using a high acceleration energy, and form the well layer 15 by activating this impurity. This manufacturing process does not require any long-time well diffusion process, which contributes to a reduction in manufacturing cost because of a short manufacturing time.

The second feature of the manufacturing process is to execute ion implantation for controlling the threshold voltage of the MOSFET 10a and ion implantation for forming the well layer 15 by using the same mask. Accordingly, the number of PEPs (the number of masks) is decreased compared to a conventional method, which contributes to a reduction in manufacturing cost.

The third feature of the manufacturing process is to simultaneously form the well portion 15a for the E type or D type MOSFET 10a, and the well portion 15b serving as a channel stopper immediately below the field oxide film by one high-energy ion implantation. Consequently, the number of PEPs (the number of masks) is decreased in comparison with a conventional method, which contributes to a reduction in manufacturing cost.

Figure 21:
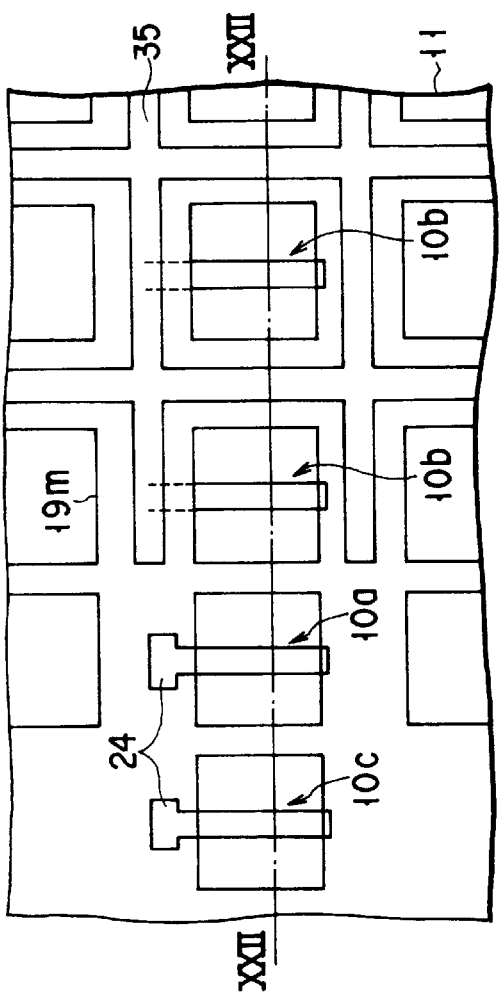
FIG. 21 is a plan view showing the layout of a semiconductor device according to the sixth embodiment of the present invention.
Figure 22:
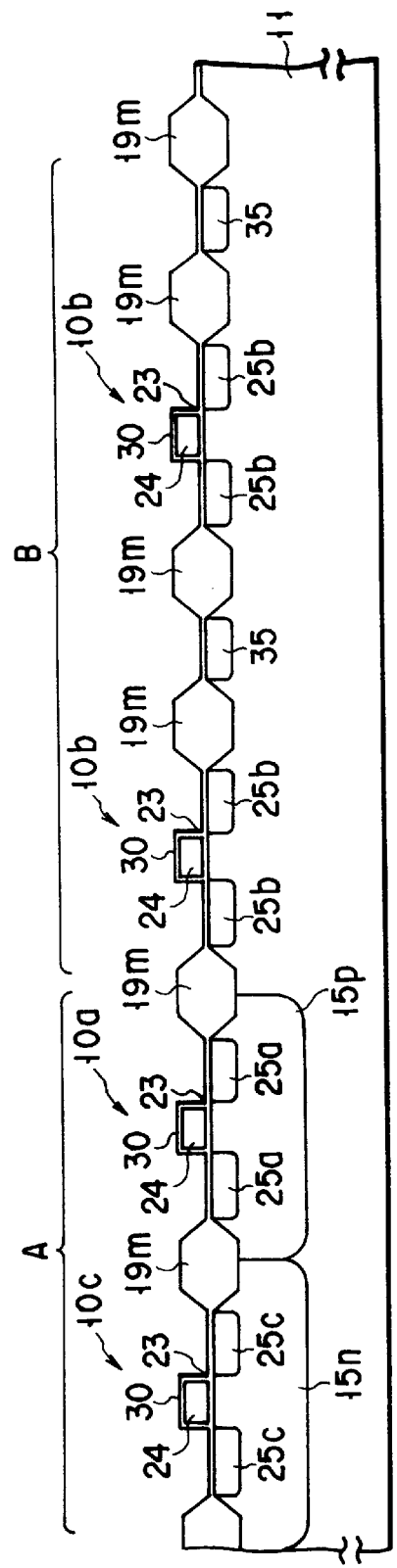
FIG. 22 is a sectional view taken along the line XXII—XXII in FIG. 21.

FIG. 21 is a plan view showing the layout of a semiconductor device according to the sixth embodiment of the present invention. FIG. 22 is a sectional view taken along the line XXII—XXII in FIG. 21.

This embodiment concerns a semiconductor device (e.g., a flash EEPROM) having E (Enhancement) type CMOS-FETs with a threshold voltage (about 0.7V) controlled by ion implantation, and an I type MOSFET with a threshold voltage of about 0.1V.

The upper region of a p-type silicon substrate 11 is formed of section A where E type or D type n- and p-channel MOSFETs 10a and 10c are formed, and section B where I type n-channel MOSFETs 10b are formed.

In section A, e.g., the E type n-channel MOSFET 10a and the E type p-channel MOSFET 10c are formed in element areas surrounded by field oxide films 19m. The n-channel MOSFET 10a is formed in a p-type well layer 15p, whereas the p-channel MOSFET is formed in an n-type well layer 15n.

The n-channel MOSFET 10a in section A has a gate oxide film 23, a gate electrode 24, and source and drain layers 25a. The p-channel MOSFET 10c in section A has a gate oxide film 23, a gate electrode 24, and source and drain layers 25c. A silicon oxide film 30 is formed on the surface of each gate electrode 24.

In section B, the I type n-channel MOSFET 10b is formed in each element area surrounded by field oxide films 19m. The MOSFET 10b is directly formed in the ground of the silicon substrate 11.

In section B, grating-like p-type intervening diffusion layers 35 which have a resistivity lower than that of the ground of the substrate 11 and function as channel stoppers are arranged between element areas. The intervening diffusion layers 35 are formed not immediately below the field oxide films 19m but between the field oxide films 19m having a rectangular flame shape.

If necessary, a p-type diffusion layer may also be formed as a channel stopper immediately below the field oxide film 19m by ion implantation at a high or low energy.

The depth of the p-type diffusion layer 35 is substantially the same as that of the source and drain layers 25c of the p-channel MOSFET 10c formed in section A. That is, the p-type diffusion layer 35 and the source and drain layers 25c of the p-channel MOSFET are simultaneously formed.

The I type n-channel MOSFET 10b in section B has a gate oxide film 23, a gate electrode 24, and source and drain layers 25b. A silicon oxide film 30 is formed on the gate electrode 24.

In the semiconductor device having the above arrangement, the I type MOSFET 10b is formed in section B. By using this MOSFET as a booster circuit based on the charge pumping technique, the chip size can be reduced.

The diffusion layer 35 functioning as a channel stopper is formed not immediately below the field oxide film 19m but a new region between the field oxide films 19m. That is, since the diffusion layer 35 can be formed at the same time as the source and drain layers 25c of the p-channel MOSFET 10c, no PEP (formation of mask) for the diffusion layer 35 is required. According to the semiconductor device of this embodiment, the manufacturing process can be simplified, which contributes to a reduction in manufacturing cost.

Figure 23:
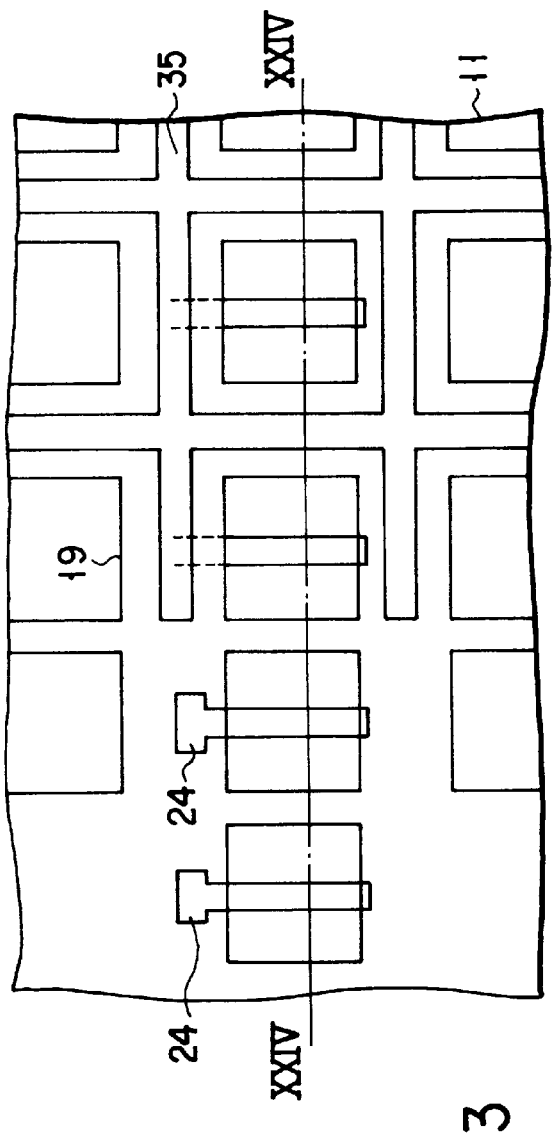
FIG. 23 is a plan view showing the layout of a semiconductor device according to the seventh embodiment of the present invention.
Figure 24:
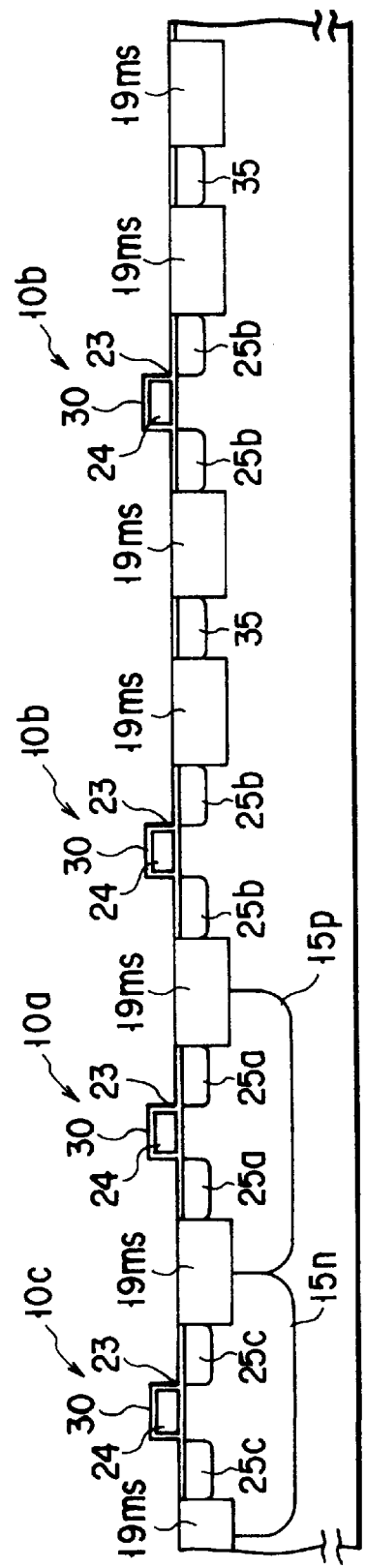
FIG. 24 is a sectional view taken along the line XXIV—XXIV in FIG. 23.

FIG. 23 is a plan view showing the layout of a semiconductor device according to the seventh embodiment of the present invention. FIG. 24 is a sectional view taken along the line XXIV—XXIV in FIG. 23.

The semiconductor device of the seventh embodiment is a modification of the sixth embodiment. More specifically, in the sixth embodiment, the field oxide film formed by LOCOS is used as an element isolation film. In the seventh embodiment, an oxide film having an STI (Shallow Trench Isolation) structure is used as an element isolation film.

According to the seventh embodiment, in section A where, e.g., E type MOSFETs 10*a* and 10*c* are to be formed, a p-type well layer 15*p* and an n-type well layer 15*n* are formed so as to extend from element areas to portions immediately below element isolation films 19*ms*. In section B where I type MOSFETs 10*b* are to be formed, p-type diffusion layers 35 are formed between element isolation films 19*ms* so as to surround element areas.

A method of manufacturing a semiconductor device according to the present invention will be described below.

This manufacturing method is applicable to the semiconductor device according to the sixth embodiment described above. This method can also be applied to the semiconductor device according to the seventh embodiment except for a method of forming an element isolation film.

As shown in FIGS. 25 and 26, a silicon oxide film 12 is formed on a p-type silicon substrate 11 by, e.g., thermal oxidation. A silicon nitride film 16 is formed on the silicon oxide film 12 by, e.g., LPCVD. A resist pattern 17 is formed on the silicon nitride film 16 by a PEP (PhotoEtching Process).

Using the resist pattern 17 as a mask, the silicon nitride film 16 is patterned by, e.g., RIE (Reactive Ion Etching). Then, the resist pattern 17 is removed.

As shown in FIG. 27, LOCOS oxidation is performed using the silicon nitride film 16 as a mask to form field oxide films 19*m* having a film thickness of about 600 nm on the silicon substrate 11. Thereafter, the silicon nitride film 16 and the silicon oxide film 12 are removed.

When an element isolation film having an STI structure is used, a trench is formed in the silicon substrate 11, and a silicon oxide film is buried in this trench using, e.g., LPCVD and CMP (Chemical Mechanical Polishing).

Figure 28:
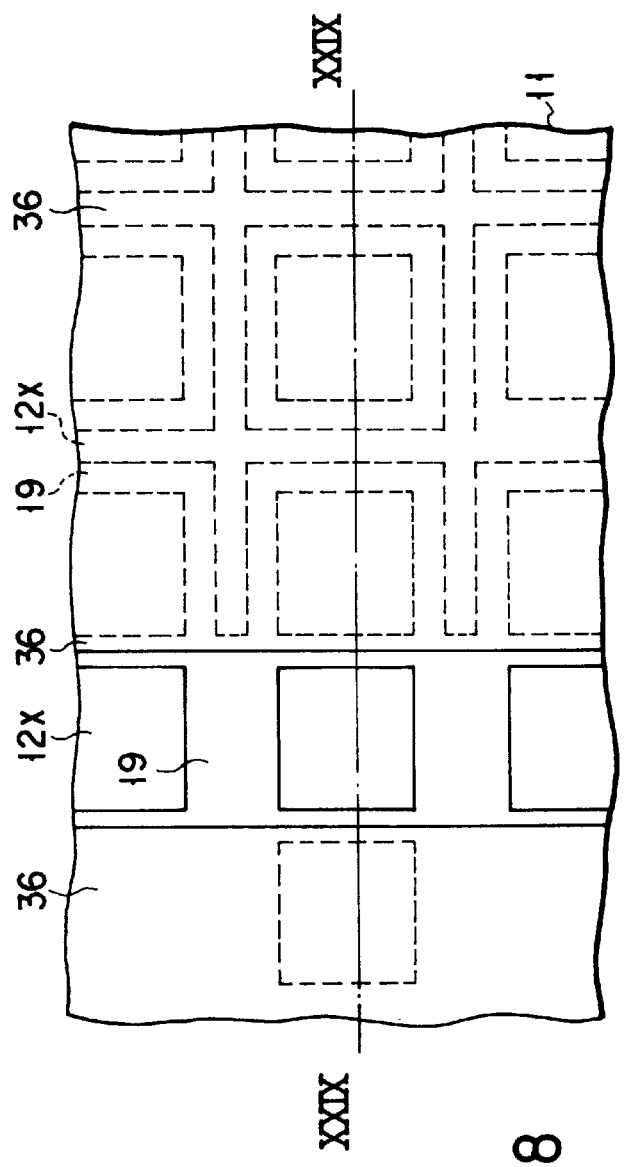
Figure 29:
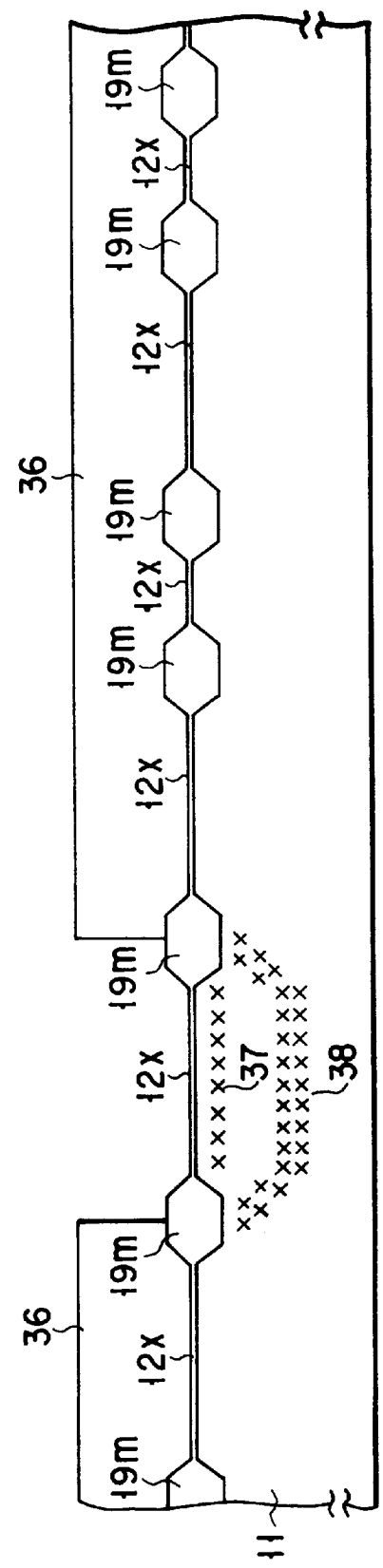

As shown in FIGS. 28 and 29, silicon oxide films 12*x* having a thickness of about 20 nm are newly formed by thermal oxidation in element areas surrounded by the field oxide films 19*m*. A resist pattern 36 is formed by a PEP (PhotoEtching Process) to have an opening at a portion corresponding to the p-type well layer 15*p* and cover a portion corresponding to the n-type well layer 15*n* in section A, and entirely cover section B where I type MOSFETs 10*b* are to be formed.

Using the resist pattern 36 as a mask, a p-type impurity (e.g., boron ions) 37 is ion-implanted in a portion corresponding to the MOSFET 10*a* at a low acceleration energy of about 40 keV and a dose of about $2.5 \times 10^{13}$ cm$^{-2}$.

Since this ion implantation (for controlling the threshold voltage of the MOSFET 10*a*) uses the low acceleration energy, the impurity 37 is implanted in only the surface portion of an element area of the silicon substrate 11 in section A.

Subsequently, using the resist pattern 36 as a mask, a p-type impurity (e.g., boron ions) 38 is ion-implanted in a portion corresponding to the well layer 15*p* at high acceleration energies of about 300 keV and about 400 keV and a dose of about $2 \times 10^{13}$ cm$^{-2}$.

Since this ion implantation (for forming the well layer 15*p*) uses the high acceleration energies, the impurity 38 is implanted to a deep portion in the silicon substrate 11, and the silicon substrate 11 immediately below the field oxide film 19*m*. After that, the resist pattern 36 is removed.

Figure 30:
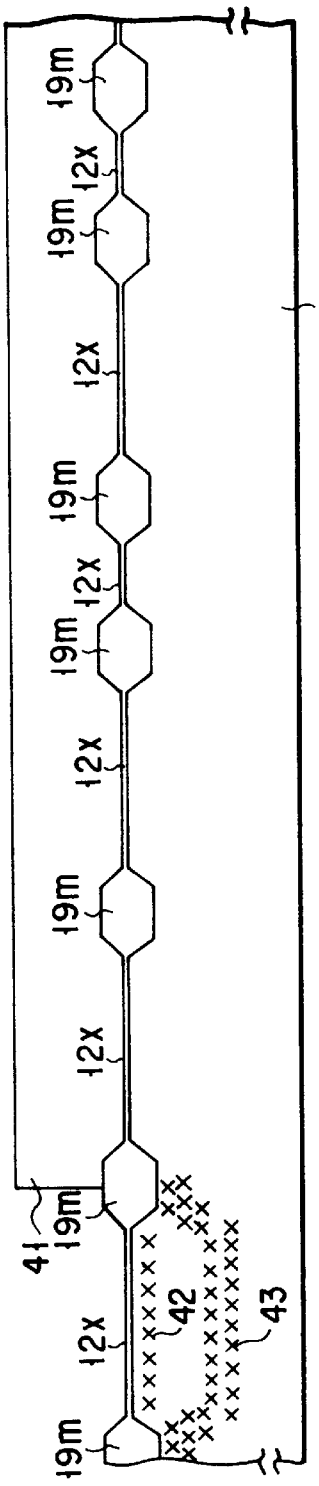

As shown in FIG. 30, a resist pattern 41 is formed by a PEP (PhotoEtching Process) to have an opening at the portion corresponding to the n-type well layer 15*n* and cover the portion corresponding to the p-type well layer 15*p* in section A, and entirely cover section B where the I type MOSFETs 10*b* are to be formed.

Using the resist pattern 41 as a mask, an p-type impurity (e.g., boron ions) 42 is ion-implanted in a portion corresponding to the MOSFET 10*c* at a low acceleration energy of about 20 keV and a dose of about $3 \times 10^{12}$ cm$^{-2}$.

Since this ion implantation (for controlling the threshold voltage of the MOSFET 10*c*) uses the low acceleration energy, the impurity 42 is implanted in only the surface portion of an element area of the silicon substrate 11 in section A.

Using the resist pattern 41 as a mask, an n-type impurity (e.g., phosphorus ions) 43 is ion-implanted in a portion corresponding to the well layer 15*n* at high acceleration energies of about 800 keV and about 600 keV and a dose of about $1 \times 10^{13}$ cm$^{-2}$.

Since this ion implantation (for forming the well layer 15*n*) uses the high acceleration energies, the impurity 43 is implanted to a deep portion in the silicon substrate 11, and the silicon substrate 11 immediately below the field oxide film 19*m*. Then, the resist pattern 41 is removed.

The high-energy ion implantation of the p-type and n-type impurities (ions) uses the two different acceleration energies, but may use one or three or more different acceleration energies. The order of ion implantation for controlling the threshold voltage and ion implantation for forming the well layer is arbitrary.

Figure 31:
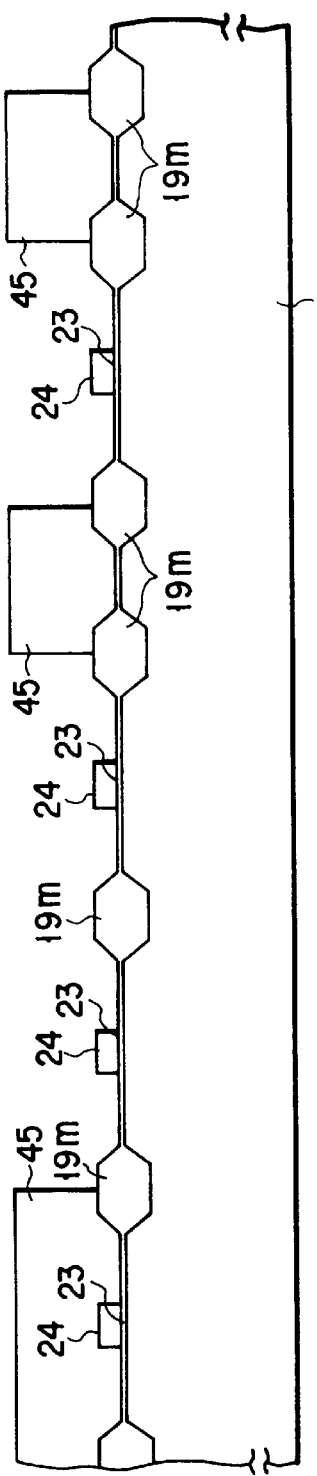

After the silicon oxide films 12*x* are removed, gate oxide films 23 are formed by, e.g., thermal oxidation in the element areas surrounded by the field oxide films 19*m*, as shown in FIG. 31. Gate electrodes 24 are respectively formed on the gate oxide films 23.

As shown in FIG. 31, a resist pattern 45 is formed by a PEP (PhotoEtching Process) to expose portions corresponding to the n-channel MOSFET 10*a* and the I type MOSFETs 10*b*, and cover portions corresponding to the p-channel MOSFET 10*c* and intervening diffusion layers 35. Using the resist pattern 45, the field oxide films 19*m*, and the gate electrodes 24 as a mask, an n-type impurity (e.g., arsenic) is implanted in portions corresponding to the source and drain layers 25*a* and 25*b* by self alignment at an acceleration energy of about 60 keV and a dose of about $4.0 \times 10^{15}$ cm$^{-2}$. Thereafter, the resist pattern 45 is removed.

Figure 32:
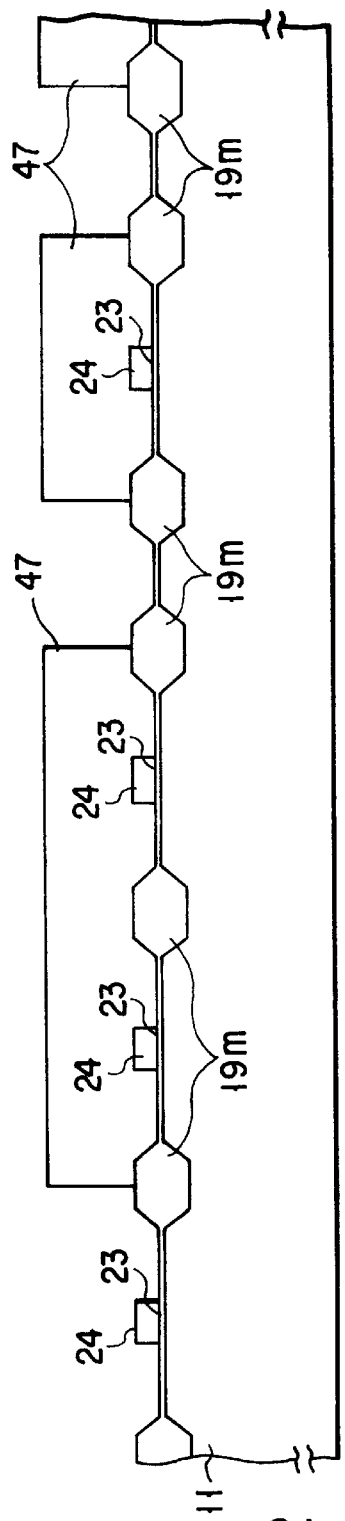
Figure 34:
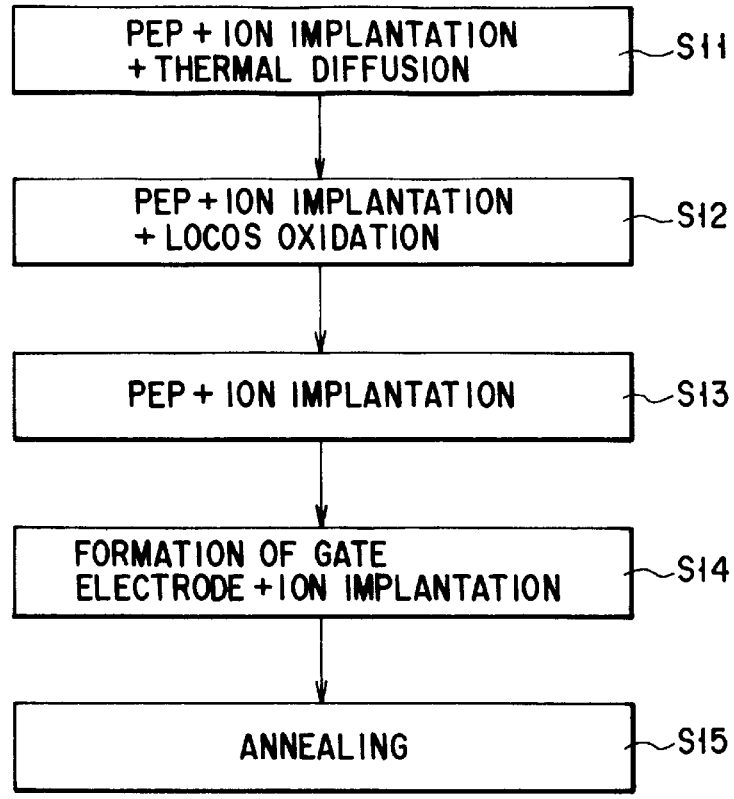
FIG. 34 is a flow chart briefly showing the main steps of the first example of the conventional manufacturing process.
Figure 36:
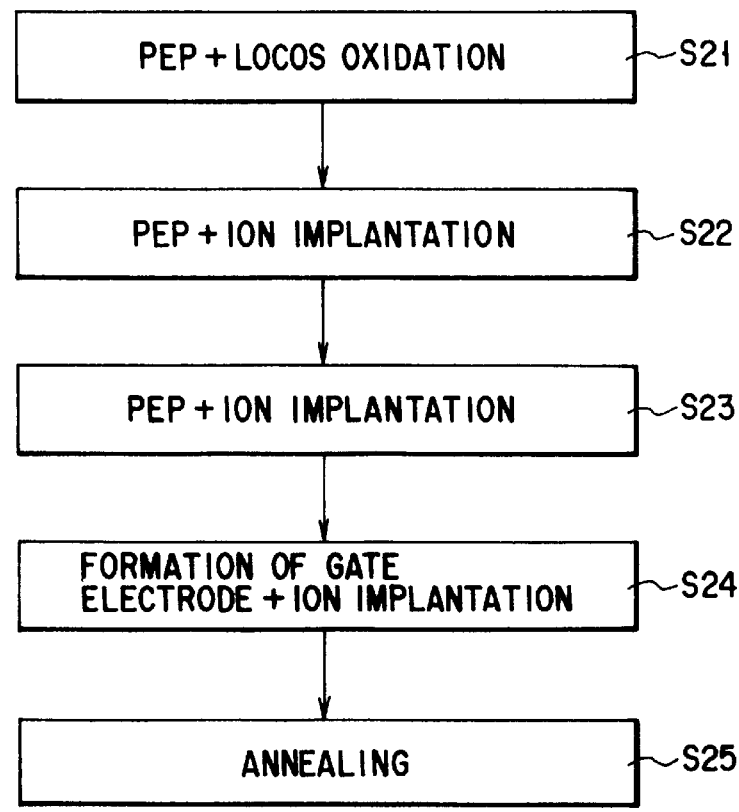
FIG. 36 is a flow chart briefly showing the main steps of the second example of the conventional manufacturing process.
Figure 37:
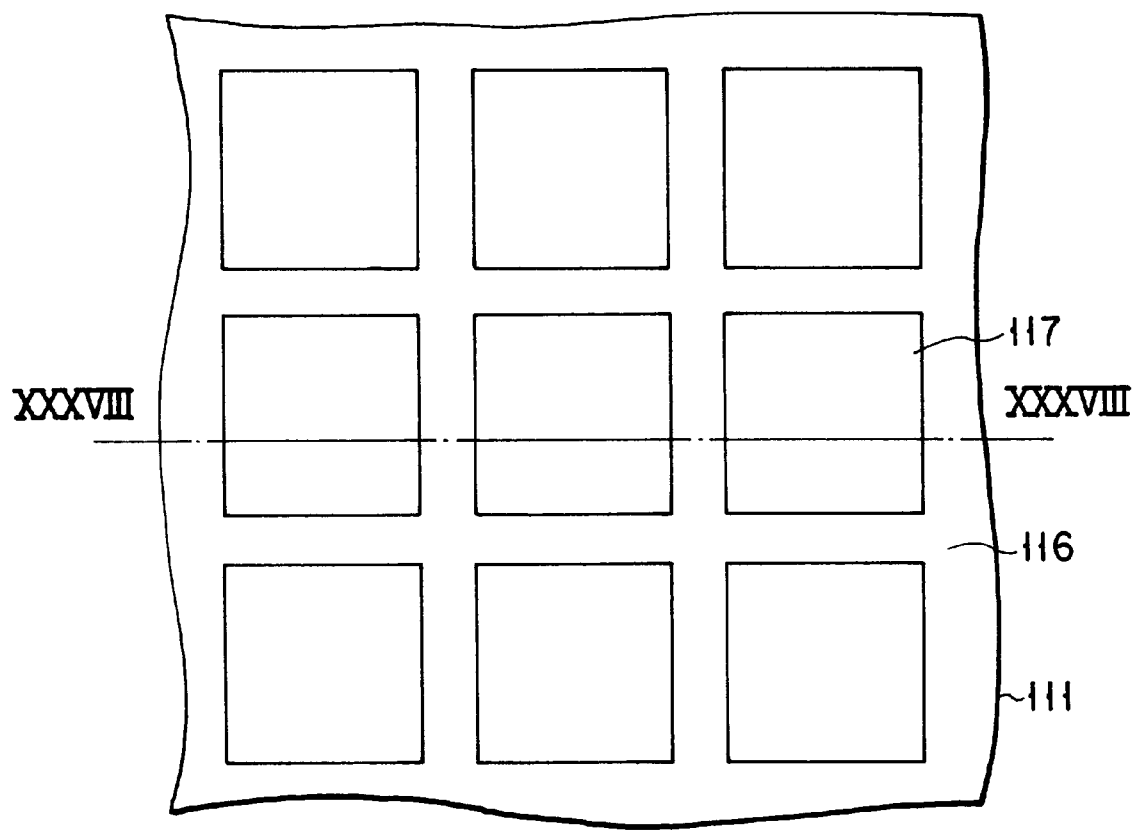
Figure 38:
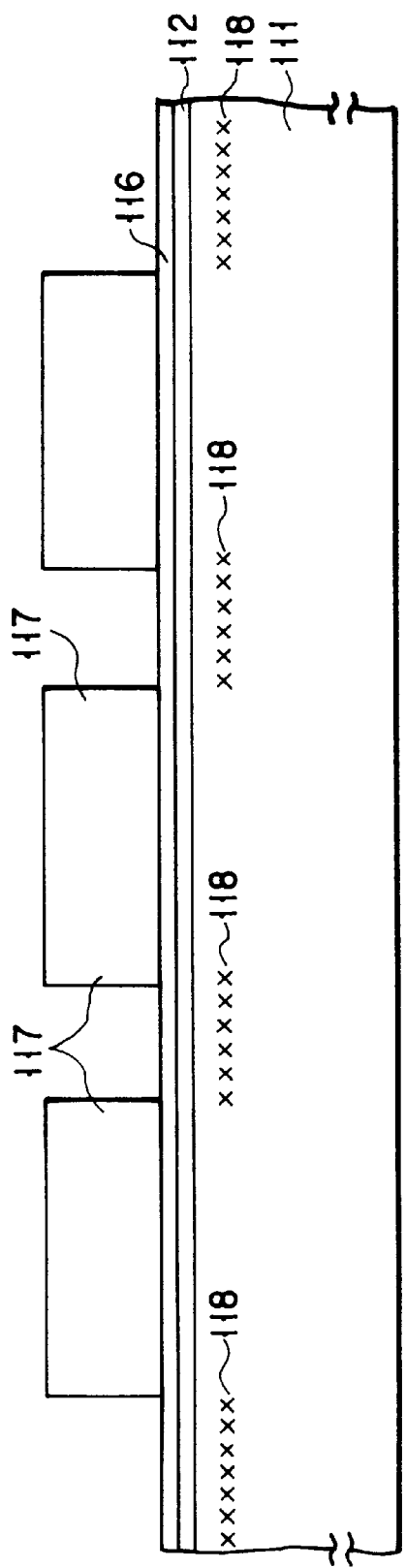
Figure 39:
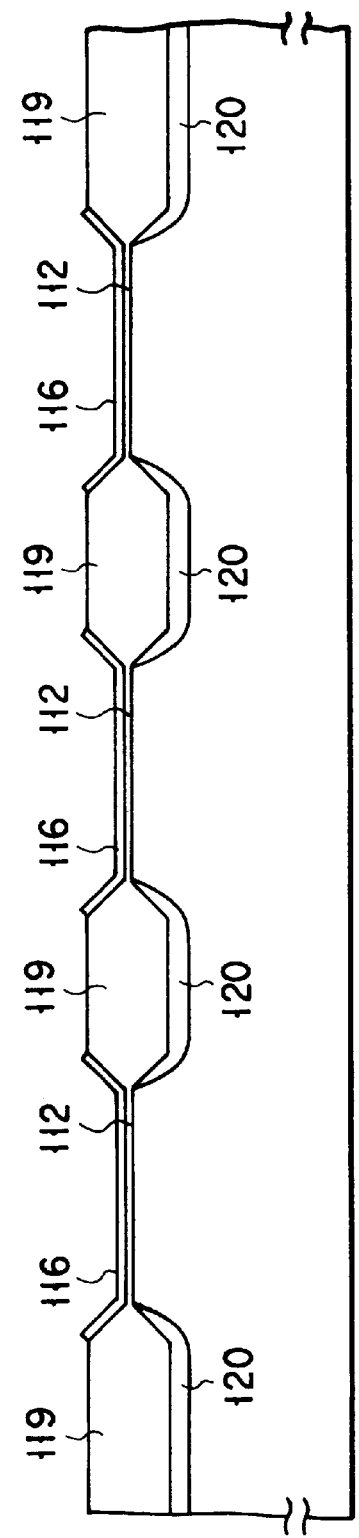
Figure 40:
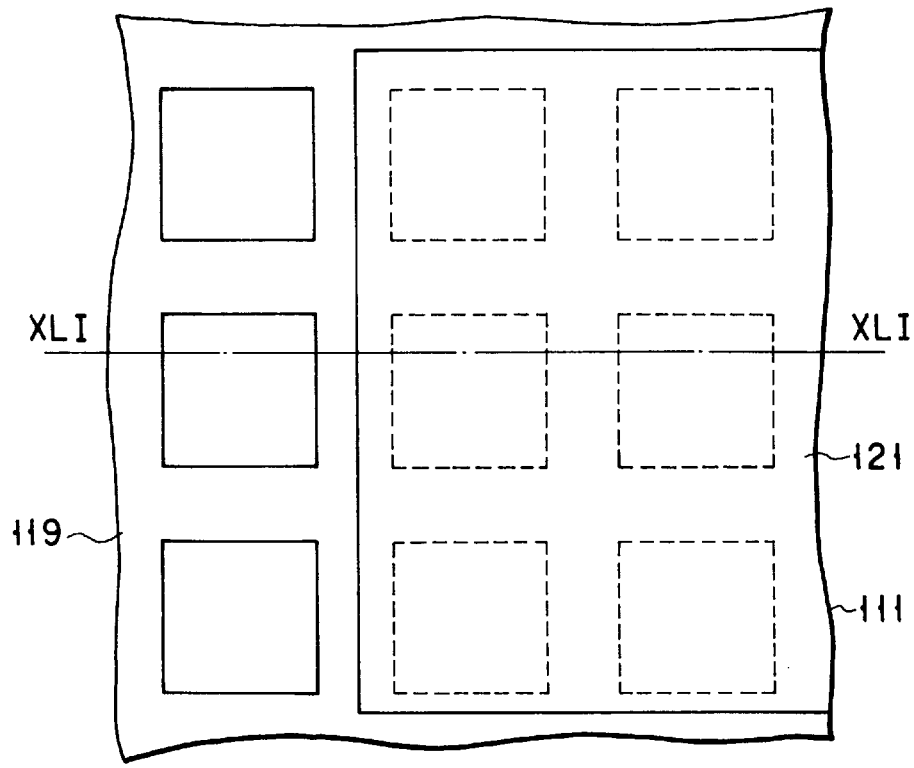
Figure 43:
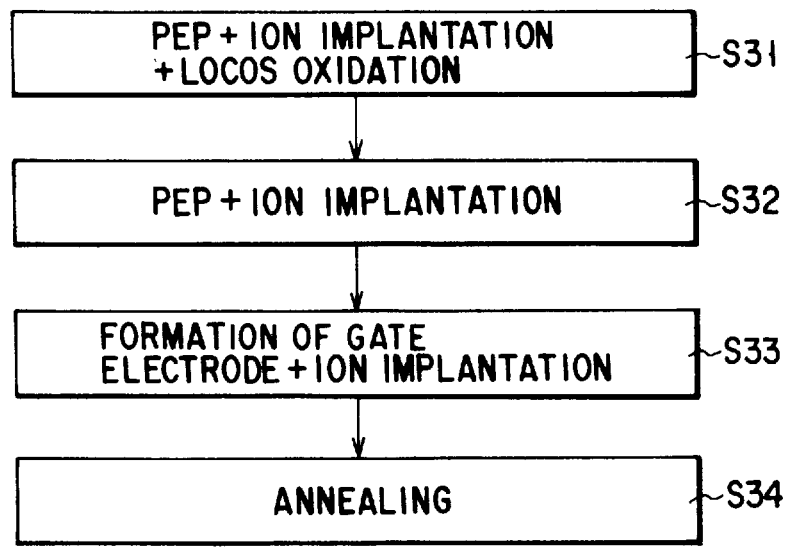
FIG. 43 is a flow chart briefly showing the main steps of the third example of the conventional manufacturing process.
Figure 41:
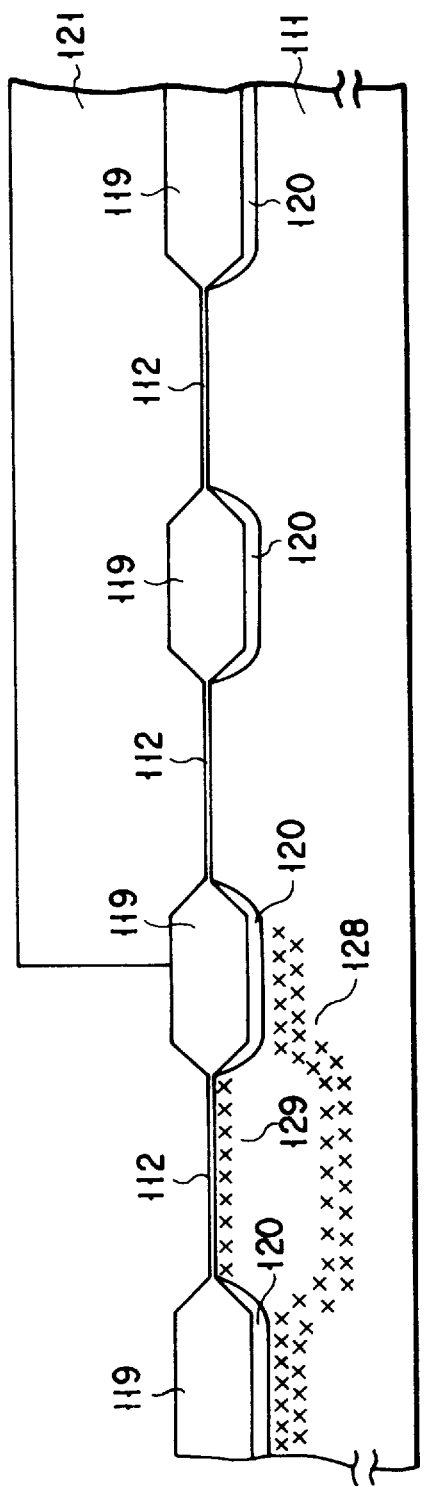
Figure 42:
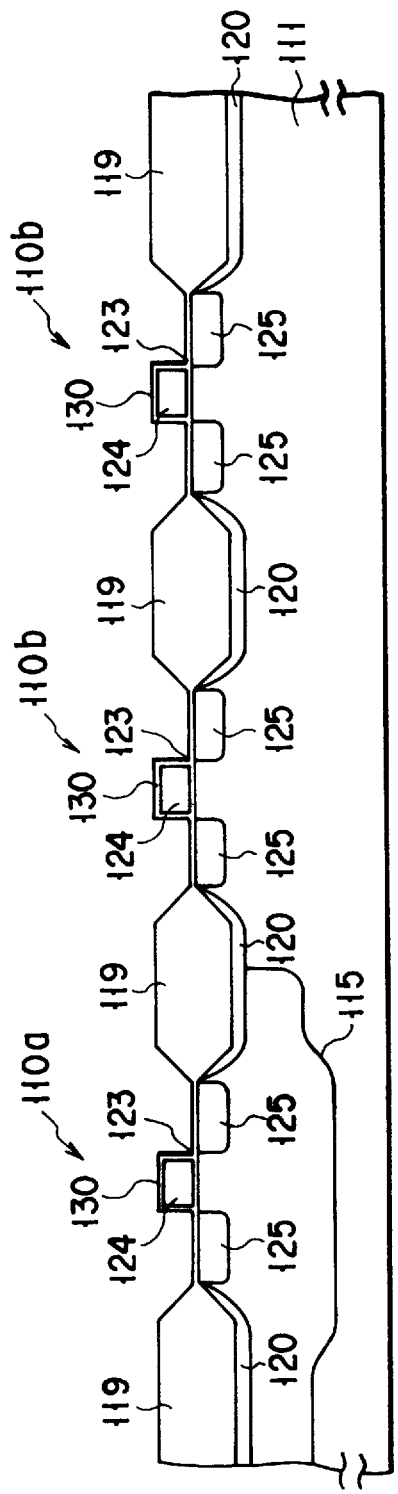

As shown in FIG. 32, a resist pattern 47 is formed by a PEP (PhotoEtching Process) to expose the portions corresponding to the p-channel MOSFET 10*c* and the intervening diffusion layers 35, and cover the portions corresponding to the n-channel MOSFET 10*a* and the I type MOSFETs 10*b*. Using the resist pattern 47, the field oxide films 19*m*, and the gate electrodes 24 as a mask, a p-type impurity (e.g., boron) is implanted in portions corresponding to the source and drain layers 25*c* by self alignment at an acceleration energy of about 60 keV and a dose of about $4.0 \times 10^{15}$ cm$^{-2}$. By this ion implantation, the p-type impurity is also implanted in the portions corresponding to the intervening diffusion layers 35. That is, ion implantation for the portions corresponding to the source and drain layers 25*c* and the intervening diffusion layers 35 is simultaneously performed. After that, the resist pattern 47 is removed.

A silicon oxide film 30 is formed on the surface of each gate electrode 24 by thermal oxidation in the oxygen atmosphere at a temperature of about 850° C. for 40 min. This annealing activates the impurities in the silicon substrate 11 to simultaneously complete the p-type well layer 15*p*, the p-type source and drain layers 25*c*, the p-type intervening diffusion layers (channel stoppers) 35, the n-type well layer 15*n*, and the source and drain layers 25*a* and 25*b* (see FIG. 22).

With the above manufacturing process, semiconductor elements (MOSFETs 10*a*, 10*b*, and 10*c*) are formed on the silicon substrate 11.

The first feature of the manufacturing process is to implant an impurity to a deep portion in the silicon substrate by using a high acceleration energy, and form the well layer by activating this impurity. This manufacturing process does not require any long-time well diffusion process, which contributes to a reduction in manufacturing cost because of a short manufacturing time.

The second feature of the manufacturing process is to execute ion implantation for controlling the threshold voltage of the MOSFET 10*a* and ion implantation for forming the well layer 15 by using the same mask. Accordingly, the number of PEPs (the number of masks) is decreased compared to a conventional method, which contributes to a reduction in manufacturing cost.

The third feature of the manufacturing process is to simultaneously perform ion implantation for the intervening diffusion layer (channel stopper) 35 formed between the field oxide films 19*m*, and ion implantation for the source and drain layers 25*c* of the p-channel MOSFET 10*c* on the silicon substrate 11. Consequently, the number of PEPs (the number of masks) is decreased in comparison with a conventional method, which contributes to a reduction in manufacturing cost.

As has been described above, the effect of decreasing the chip size and reducing the cost can be most prominently obtained when the present invention is applied to a semiconductor device having both an E type MOSFET requiring ion implantation for controlling the threshold voltage, and an I type MOSFET not requiring it. The present invention can be similarly applied to p- and n-channel MOSFETs. Instead of the MOSFET, the present invention is also applicable to a MISFET in which a gate insulating film is made from an insulating film other than an oxide film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type, having a first resistivity, said semiconductor substrate having first and second element areas, the first element area surrounded by a first element isolation area and the second element area surrounded by a second element isolation area; and
   a well layer of the first conductivity type formed in said semiconductor substrate, said well having first, second and third portions which have a common second resistivity less than the first resistivity, the first portion being located in the first element area, the second portion being located immediately below the first element isolation area, and the third portion being located immediately below the second element isolation area.

2. The device according to claim 1, further comprising:
   a first transistor arranged in the first element area, having source and drain layers of a second conductivity type interposed in a channel region in a channel-length direction, and a gate electrode facing the channel region via a gate insulating film; and
   a second transistor arranged in the second element area, having source and drain layers of the second conductivity type interposed in a channel region in a channel-length direction, and a gate electrode facing the channel region via a gate insulating film.

3. The device according to claim 2, wherein the second portion of said well layer and said source and drain layers of said second transistor are spaced apart from each other by a certain offset width.

4. The device according to claim 2, wherein the second portion of said well layer and said source and drain layers of said second transistor are in contact with each other.

5. The device according to claim 2, wherein the second portion of said well layer and said source and drain layers of said second transistor are in contact with each other in the channel-length direction of said second transistor, and are spaced apart from each other by a certain offset width in a direction perpendicular to the channel-length direction of said second transistor.

6. The device according to claim 2, wherein the first portion of said well layer is deeper than the second portion.

7. The device according to claim 2, wherein said first element isolation area includes an oxide film formed by oxidizing said semiconductor substrate.

8. The device according to claim 2, wherein said isolation layer consists essentially of an insulating layer buried in a trench formed in said common surface.

9. The device according to claim 2, wherein the channel region of said second transistor has substantially the same resistivity as the first resistivity.

10. The device according to claim 2, wherein said second transistor has a threshold voltage whose absolute value is smaller than an absolute value of a threshold voltage of said first transistor.

11. The device according to claim 1, further comprising an isolation layer consisting essentially of an insulator surrounding the second element area, wherein the second portion of said well layer is formed immediately below said isolation layer.

12. The device according to claim 1, wherein the first element isolation area and the second element isolation area are integrated with each other.

13. A semiconductor device comprising:
    a semiconductor substrate of a first conductivity type having a common surface and a ground with a first resistivity;
    first and second isolation layers consisting essentially of insulators formed in said common surface, said first and second isolation layers surrounding part of said substrate and respectively defining first and second element areas with the first resistivity, which consist essentially of said ground;
    first and second transistors formed of field effect transistors with channels of a second conductivity type which are respectively arranged in the first and second element areas, each of said first and second transistors having source and drain layers of the second conductivity type which interpose a channel region in a channel-length direction, and a gate electrode facing the channel region via a gate insulating film; and an intervening diffusion layer of the first conductivity type formed in said common surface to separate said first and second isolation layers, and having a second resistivity lower than the first resistivity.

14. The device according to claim 13, further comprising:

a well layer of the second conductivity type formed in said common surface to define a third element area; and a third transistor formed of a field effect transistor with a channel of the first conductivity type which is arranged in the third element area, said third transistor having source and drain layers of the first conductivity type which interpose a channel region in a channel-length direction, and a gate electrode facing the channel region of said third transistor via a gate insulating film, said intervening diffusion layer and said source and drain layers of said third transistor having substantially the same depth.

15. The device according to claim 13, wherein the channel regions of said first and second transistors have substantially the same resistivity as the first resistivity.

16. The device according to claim 13, wherein each isolation layer consists essentially of an insulating oxide film formed by oxidizing said ground.

17. The device according to claim 13, wherein said isolation layer consists essentially of an insulating layer buried in a trench formed in said common surface.

18. A semiconductor device comprising:

a semiconductor substrate of a first conductivity type having a first resistivity, the semiconductor substrate having first and second element areas, the first element area surrounded by a first element isolating area, and the second element areas surrounded by second element isolating areas, respectively;

a well layer of the first conductivity type formed in the first element area, said well layer having a second resistivity less than the first resistivity;

a first transistor of a second conductivity type, arranged in the first element area, having source and drain layers of the second conductivity type interposed in a channel region in a channel-length direction, and a gate electrode located above the channel region via a gate insulating film;

second transistors of the second conductivity type, arranged in the second element areas, having source and drain layers of the second conductivity type which is interposed a channel region in a channel-length direction, and a gate electrode located above the channel region via a gate insulating film; and a diffusion layer of the first conductivity type formed in an area located between the second element isolating areas, said diffusion layer having a third resistivity substantially equal to said second resistivity.

19. The device according to claim 18, wherein said diffusion layer and said source and drain layers of said first transistor have substantially the same depth.

20. The device according to claim 18, wherein the channel regions of said first and second transistors have substantially the same resistivity as the first resistivity.

21. The device according to claim 18, wherein each of the first and second element isolating areas consist essentially of an insulating oxide film formed by oxidizing said semiconductor substrate.

22. The device according to claim 18, wherein each of the first and second element isolating areas consist essentially of an insulating layer buried in a trench formed in said semiconductor substrate.

23. The device according to claim 18, wherein the first element isolating area and the second element isolating areas are integrated with each other.

24. A semiconductor device comprising:

a semiconductor substrate of a first conductivity type with a first resistivity, the semiconductor substrate having a non-element area and element area;

a transistor of a second conductivity type, arranged in the element area, having source and drain layers of the second conductivity type interposed in a channel region in a channel-length direction, and a gate electrode located above the channel region via a gate insulating film;

a plurality of element isolation films formed in the non-element area; and at least one diffusion layer of the first conductivity type formed in an area located between two of the plurality of element isolation films, said diffusion layer having a second resistivity less than the first resistivity.

25. The device according to claim 24, wherein the at least one diffusion layer and said source and drain layer have substantially the same depth.

26. The device according to claim 24, further comprising a gate insulating film formed on the at least one diffusion layer in the area.

27. The device according to claim 24, further comprising a gate insulating film formed on the at least one diffusion layer; and wherein the at least one diffusion layer and said source and drain layers of said transistor have substantially the same depth.

28. A semiconductor device comprising:

a semiconductor substrate having a first resistivity;

a well layer formed in said substrate and having a second resistivity which is lower than said first resistivity;

an element isolation film formed on said substrate; and a diffusion layer formed below said element isolation film and having a third resistivity equal to said second resistivity.

* * * * *